United States Patent
Price et al.

(10) Patent No.: US 10,455,681 B2
(45) Date of Patent: *Oct. 22, 2019

(54) TARGET TRAJECTORY METROLOGY IN AN EXTREME ULTRAVIOLET LIGHT SOURCE

(71) Applicant: ASML Netherlands B.V., Veldhoven (NL)

(72) Inventors: Michael Leslie Price, Escondido, CA (US); Cory Alan Stinson, San Diego, CA (US); Mark Joseph Mitry, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/174,464

(22) Filed: Oct. 30, 2018

(65) Prior Publication Data

US 2019/0069386 A1    Feb. 28, 2019

Related U.S. Application Data

(63) Continuation of application No. 15/265,373, filed on Sep. 14, 2016, now Pat. No. 10,149,375.

(51) Int. Cl.
  *H05G 2/00* (2006.01)
  *H01S 3/23* (2006.01)
(52) U.S. Cl.
  CPC ........... *H05G 2/008* (2013.01); *H01S 3/2366* (2013.01)
(58) Field of Classification Search
  CPC ........... H05G 2/00; H05G 2/001; H05G 2/008
  (Continued)

(56) References Cited

U.S. PATENT DOCUMENTS 8,872,144 B1   10/2014   Fomenkov
9,778,022 B1   10/2017   Odle et al.
(Continued)

FOREIGN PATENT DOCUMENTS

WO    2013174620 A1    11/2013

OTHER PUBLICATIONS

Lee W. Young, U.S. International Searching Authority, International Search Report and Written Opinion, counterpart PCT Application No. PCT/US2017/051208, dated Jan. 11, 2018, 10 pages total.

*Primary Examiner* — Jason L McCormack
(74) *Attorney, Agent, or Firm* — DiBerardino McGovern IP Group LLC

(57) ABSTRACT

A method is described for measuring a moving property of a target. The method includes: forming a remaining plasma that at least partially coincides with an extended target region, the remaining plasma being a plasma formed from an interaction between a prior target and a prior radiation pulse in a target space; releasing a current target along a trajectory toward the target space that is at least partly overlapping the extended target region; determining one or more moving properties of the current target when the current target is within the extended target region and after a prior and adjacent target has interacted with a prior radiation pulse in the target space; and if any of the determined one or more moving properties of the current target are outside an acceptable range, then adjusting one or more characteristics of a radiation pulse directed toward the target space.

23 Claims, 18 Drawing Sheets

(58) Field of Classification Search
USPC .................................................. 250/504 R
See application file for complete search history.

(56) References Cited

U.S. PATENT DOCUMENTS

| | | | | |
|---|---|---|---|---|
| 10,149,375 | B2* | 12/2018 | Price | H05G 2/008 |
| 2004/0262545 | A1 | 12/2004 | Hartlove et al. | |
| 2005/0199829 | A1* | 9/2005 | Partlo | B82Y 10/00 |
| | | | | 250/504 R |
| 2013/0043401 | A1* | 2/2013 | Graham | H05G 2/003 |
| | | | | 250/372 |
| 2013/0119232 | A1* | 5/2013 | Moriya | G01J 1/4257 |
| | | | | 250/201.1 |
| 2015/0083936 | A1* | 3/2015 | Wehrens | H05G 2/006 |
| | | | | 250/504 R |
| 2015/0179401 | A1 | 6/2015 | Gambino et al. | |
| 2015/0189728 | A1 | 7/2015 | Tao et al. | |
| 2015/0342016 | A1 | 11/2015 | Rafac et al. | |
| 2016/0192468 | A1 | 6/2016 | Rafac et al. | |
| 2016/0234920 | A1* | 8/2016 | Suzuki | H05G 2/003 |
| 2018/0077786 | A1 | 3/2018 | Price et al. | |

* cited by examiner

TARGET TRAJECTORY METROLOGY IN AN EXTREME ULTRAVIOLET LIGHT SOURCE

CROSS-REFERENCE TO RELATED APPLICATION

This application is a continuation of U.S. patent application Ser. No. 15/265,373, filed Sep. 14, 2016 and titled TARGET TRAJECTORY METROLOGY IN AN EXTREME ULTRAVIOLET LIGHT SOURCE, which is incorporated herein by reference in its entirety.

TECHNICAL FIELD

The disclosed subject matter relates to a system and method for measuring changes to aspects of a target along its trajectory in a laser produced plasma extreme ultraviolet light source.

BACKGROUND

Extreme ultraviolet (EUV) light, for example, electromagnetic radiation having wavelengths of around 50 nm or less (also sometimes referred to as soft x-rays), and including light at a wavelength of about 13 nm, can be used in photolithography processes to produce extremely small features in substrates, for example, silicon wafers.

Methods to produce EUV light include, but are not necessarily limited to, converting a material that has an element, for example, xenon, lithium, or tin, with an emission line in the EUV range in a plasma state. In one such method, often termed laser produced plasma ("LPP"), the required plasma can be produced by irradiating a target material, for example, in the form of a droplet, plate, tape, stream, or cluster of material, with an amplified light beam that can be referred to as a drive laser. For this process, the plasma is typically produced in a sealed vessel, for example, a vacuum chamber, and monitored using various types of metrology equipment.

SUMMARY

In some general aspects, a method is described for measuring a moving property of a target as it travels along its trajectory in a laser produced plasma extreme ultraviolet light source. The method includes: forming a remaining plasma that at least partially coincides with an extended target region, the remaining plasma being a plasma formed from an interaction between a prior target and a prior radiation pulse in a target space; releasing a current target along a trajectory toward the target space that is at least partly overlapping the extended target region, the current target including a component that emits extreme ultraviolet (EUV) light when converted to plasma; determining one or more moving properties of the current target when the current target is within the extended target region and after a prior and adjacent target has interacted with a prior radiation pulse in the target space; and if any of the determined one or more moving properties of the current target are outside an acceptable range, then adjusting one or more characteristics of a radiation pulse directed toward the target space.

Implementations can include one or more of the following features. For example, the method can also include interacting the radiation pulse with a present target in the target space. The present target is either the current target that has entered the target space or another target that has entered the target space. The other target enters the target space at a time that follows the time when the current target enters the target space.

The adjustment to the one or more characteristics of the radiation pulse directed toward the target space can cause an adjustment in a relative position between the radiation pulse and the present target.

The one or more moving properties of the current target can be determined by determining one or more of a speed of the current target, a direction of the trajectory of the current target, and an acceleration of the current target.

The radiation pulse can deliver energy to the present target to modify a geometric distribution of the present target. The method can include, after directing the radiation pulse toward the present target, directing a main radiation pulse toward the present target to thereby convert at least part of the present target into plasma that emits extreme ultraviolet light.

The method can include analyzing the determined one or more moving properties, wherein adjusting the one or more characteristics of the radiation pulse is based on the analysis of the determined one or more moving properties of the current target.

The one or more characteristics of the radiation pulse can be adjusted by adjusting one or more of a timing of a release of the radiation pulse and a direction at which the radiation pulse travels.

The one or more moving properties of the current target can be determined by: detecting a first interaction between a first diagnostic light beam and the current target at a first location within the extended target region; detecting a second interaction between a second diagnostic light beam and the current target at a second location within the extended target region, the second location being distinct from the first location; and determining the one or more moving properties based on the detections of the first and second interactions. The one or more moving properties of the current target can be determined by: directing the first diagnostic light beam toward the current target at the first location; and directing the second diagnostic light beam toward the current target at the second location.

The first diagnostic beam can be directed toward the current target at the first location by directing the first diagnostic beam along a first direction toward the current target; and the second diagnostic beam can be directed toward the current target at the second location by directing the second diagnostic beam along a second direction toward the current target, the second direction is not parallel with the first direction.

The first interaction can be detected by detecting light that is produced from the interaction between the current target and the first diagnostic beam at a first time. The second interaction can be detected by detecting light that is produced from the interaction between the current target and the second diagnostic beam at a second time that is distinct from the first time. The one or more moving properties of the current target can be determined based on an analysis of the detections of the light. The light can be detected by detecting a one-dimensional aspect of the light and producing a one-dimensional signal.

The method can include detecting a third interaction between a third diagnostic light beam and the current target at a third location within the extended target region, the third location being distinct from the first and second locations.

In other general aspects, an apparatus includes a chamber that defines a target space, a first region, and a second region closer to the target space than the first region; a target delivery system; a diagnostic system; and a control system. The target delivery system is configured to release a target along a trajectory toward the target space, the trajectory overlapping both the first region and the second region, the target comprising a material that emits extreme ultraviolet (EUV) light when converted to plasma and the target having a first moving property in the first region and a second moving property in the second region, the second moving property being different from the first moving property. The diagnostic system produces a diagnostic probe that interacts with the target in the second region and outputs data relating to the interaction. The control system is configured to: receive the data output from the diagnostic system; analyze the outputted data; and determine the second moving property of the target based on an analysis of the data.

Implementations can include one or more of the following features. For example, the apparatus can include an optical source configured to produce a plurality of radiation pulses that are directed toward the target space. The second region can at least partially overlap an extended target region. The extended target region is defined by a region in which remaining plasma is formed from an interaction between a prior target and a prior radiation pulse from the plurality of radiation pulses.

The control system can be configured to control a relative position between a current radiation pulse and a present target based on the determined second moving property of the target. The apparatus can include an adjustment system coupled to the optical source and to the control system. The control system is configured to control a relative position between a current radiation pulse and the present target by sending a control signal to the adjustment system, the control signal causing the adjustment system to adjust one or more of a timing of a release of the current radiation pulse and a direction at which the current radiation pulse travels.

The diagnostic system can include a light source that produces at least a first diagnostic light beam and a second diagnostic light beam. The first diagnostic light beam can be directed toward the target to provide a first interaction between the first diagnostic light beam and the target at a first location within the second region; and the second diagnostic light beam can be directed toward the target to provide a second interaction between the second diagnostic light beam and the target at a second location within the second region. The diagnostic system can include a detection system that detects the first interaction and the second interaction, the detection system configured to output the data relating to the first and second interactions. The detection system can be configured to detect a light that is produced from the first interaction and to detect light that is produced from the second interaction.

The second moving property of the target can be one or more of a speed of the target, a direction of the target trajectory, and an acceleration of the target.

In other general aspects, a method is described for measuring a moving property of a target as it travels along a trajectory in a laser produced plasma extreme ultraviolet light source. The method includes: releasing a current target along a trajectory toward a target space, the current target including a component that emits extreme ultraviolet (EUV) light when converted to plasma; directing a preliminary radiation pulse toward the target space to deliver energy to the current target to modify a geometric distribution of the current target; directing a main radiation pulse toward the target space, an interaction between the main radiation pulse and the current target converting at least part of the current target into plasma that emits extreme ultraviolet light; determining one or more moving properties of the current target before the current target enters the target space; and controlling one or more of a relative position between the main radiation pulse and a present target, and a relative position between the preliminary radiation pulse and a present target based on the determined one or more moving properties of the current target. The present target is either the current target that has entered the target space or another target that has entered the target space after the current target has interacted with the preliminary radiation pulse and the main radiation pulse.

Implementations can include one or more of the following features. For example, the one or more moving properties of the current target can be determined by measuring one or more of a speed of the current target, an acceleration of the current target, and a direction at which the current target moves.

The method can include detecting a first interaction between a first diagnostic light beam and the current target at a first location; and detecting a second interaction between a second diagnostic light beam and the current target at a second location that is distinct from the first location. The one or more moving properties of the current target can be determined by analyzing the detections of the first and second interactions.

The method can include: directing the first diagnostic light beam toward the current target at the first location; and directing the second diagnostic light beam toward the current target at the second location. The first interaction can be detected by detecting light that is produced from the first interaction; and the second interaction can be detected by detecting light that is produced from the second interaction.

The method can include detecting a third interaction between a third diagnostic light beam and the current target at a third location that is distinct from the first and second locations.

The relative position between the preliminary radiation pulse and the present target can be controlled based on an analysis of the determined moving property of the target. The relative position between the preliminary radiation pulse and the present target can be controlled by adjusting one or more of a timing of a release of the preliminary radiation pulse and a direction at which the preliminary radiation pulse travels.

In other general aspects, a method is described for measuring a moving property of a target as it travels along a trajectory in a laser produced plasma extreme ultraviolet light source. The method includes releasing a target along its trajectory toward a target space, the target having a first moving property in a first region along the trajectory and having a second moving property in a second region along the trajectory, the second region being closer to the target space than the first region and the second moving property being different from the first moving property; and determining the second moving property of the target.

Implementations can include one or more of the following features. For example, the second moving property of the target can be determined by determining one or more of a second speed of the target; a second acceleration of the target; and a second direction at which the target moves. The target can emit extreme ultraviolet light when converted to a plasma.

The method can include directing a radiation pulse toward the target space, the radiation pulse converting at least part of the target into plasma that emits extreme ultraviolet light when the radiation pulse interacts with the target. The method can include, prior to directing the radiation pulse toward the target space, directing a preliminary radiation pulse toward the target in the target space to deliver energy to the target to modify a geometric distribution of the target.

The method can include controlling one or more of a relative position between the preliminary radiation pulse and the target and a relative position between the radiation pulse and the target based on the determined second moving property of the target. The method can include analyzing the determined second moving property, wherein controlling the relative position between the preliminary radiation pulse and the target or the relative position between the radiation pulse and the target is based on the analysis of the determined second moving property of the target.

The relative position between the preliminary radiation pulse and the target can be controlled by adjusting one or more of a timing of a release of the preliminary radiation pulse and a direction at which the preliminary radiation pulse travels; and the relative position between the radiation pulse and the target can be controlled by adjusting one or more of a timing of a release of the radiation pulse and a direction at which the radiation pulse travels.

The second moving property of the target can be determined by: detecting a first interaction between a first diagnostic light beam and the target at a first location within the second region; detecting a second interaction between a second diagnostic light beam and the target at a second location within the second region, the second location being distinct from the first location; and determining the second moving property based on the detections of the first and second interactions.

The second moving property of the target can be determined by: directing the first diagnostic light beam toward the target at the first location within the second region; and directing the second diagnostic light beam toward the target at a second location within the second region. The first diagnostic beam can be directed toward the target at the first location within the second region by directing the first diagnostic beam along a first direction toward the target; and the second diagnostic beam can be directed toward the target at the second location within the second region by directing the second diagnostic beam along a second direction toward the target, the second direction is not parallel with the first direction.

The first interaction can be detected by detecting light that is produced from the first interaction; the second interaction can be detected by detecting light that is produced from the second interaction; and the second moving property can be determined based on the detections of the light.

The method can also include detecting a third interaction between a third diagnostic light beam and the target at a third location within the second region, the third location being distinct from the first and second locations.

The second moving property of the target can be determined by determining the second moving property of the target along a first direction. The method can include determining a moving property of the target along a second direction that is perpendicular to the first direction. The second moving property of the target along the first direction can be determined by detecting a time stamp associated with an interaction between the target and the diagnostic light beam.

DRAWING DESCRIPTION

Figure 14A:
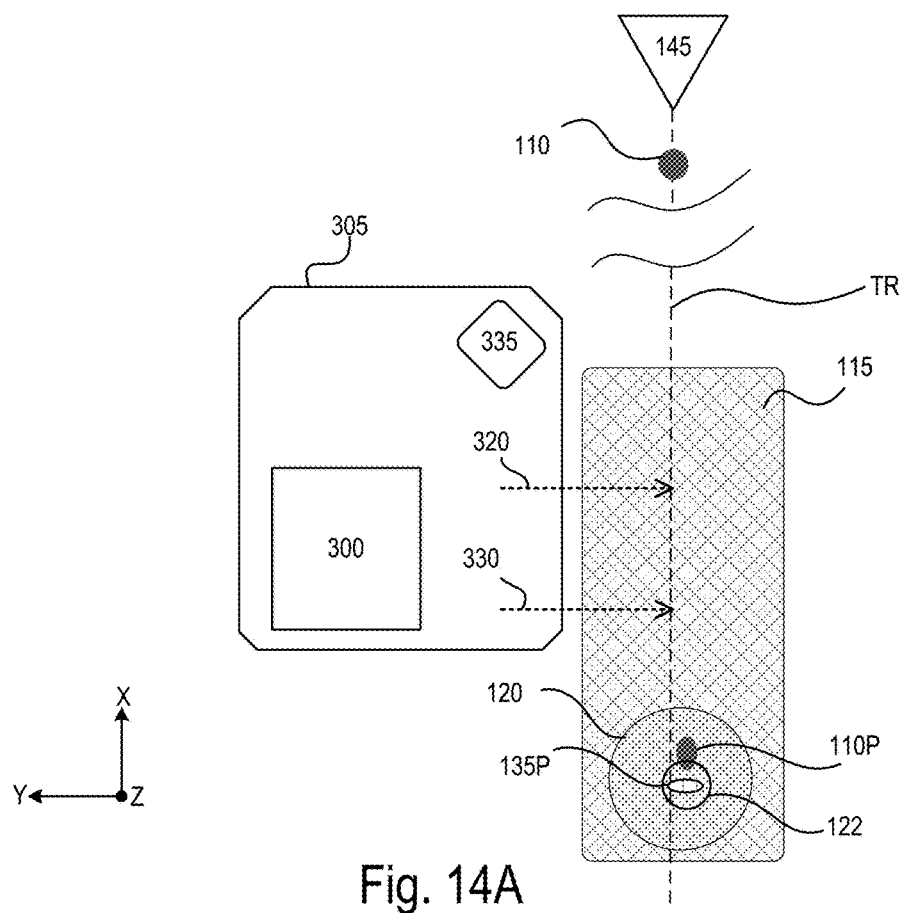
FIG. 14A is a schematic diagram of an exemplary diagnostic system, extended target region, and target space as viewed along the Z direction of the EUV light source of FIG.
Figure 14B:
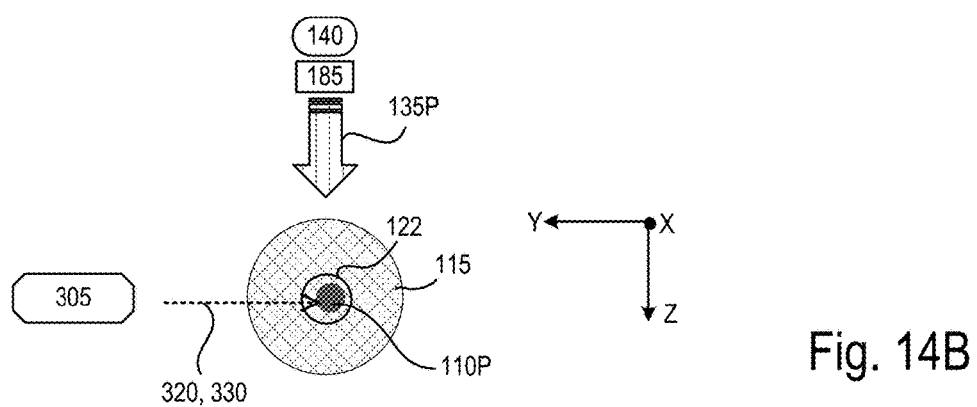
Figure 15A:
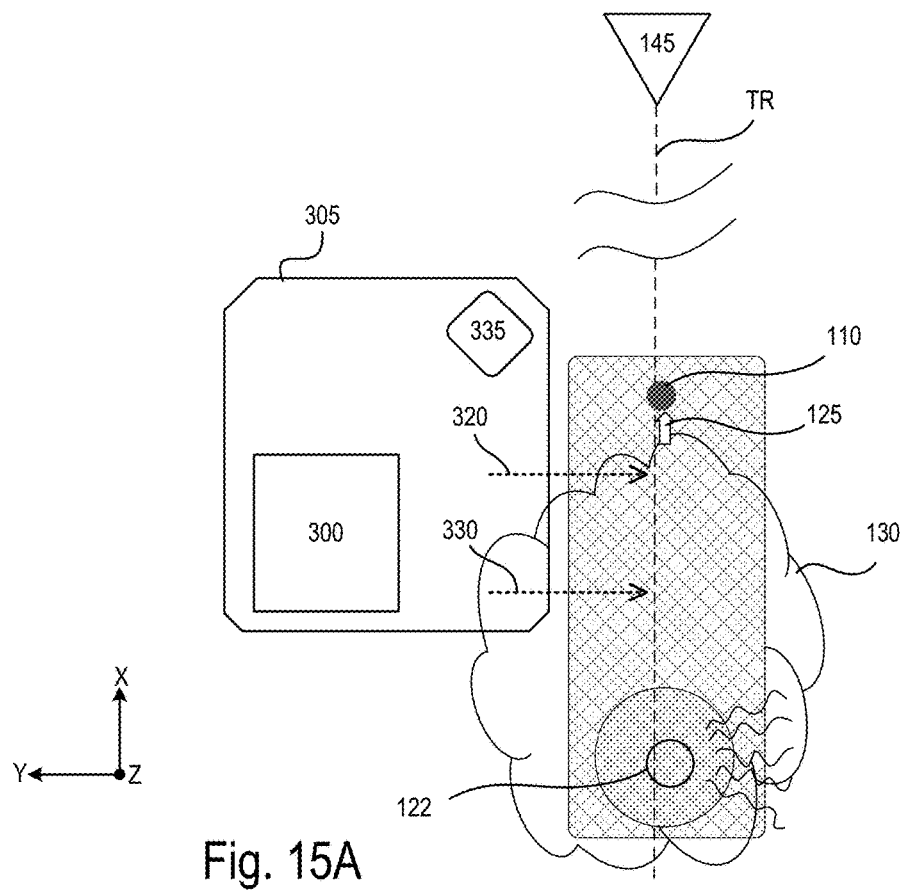
Figure 15B:
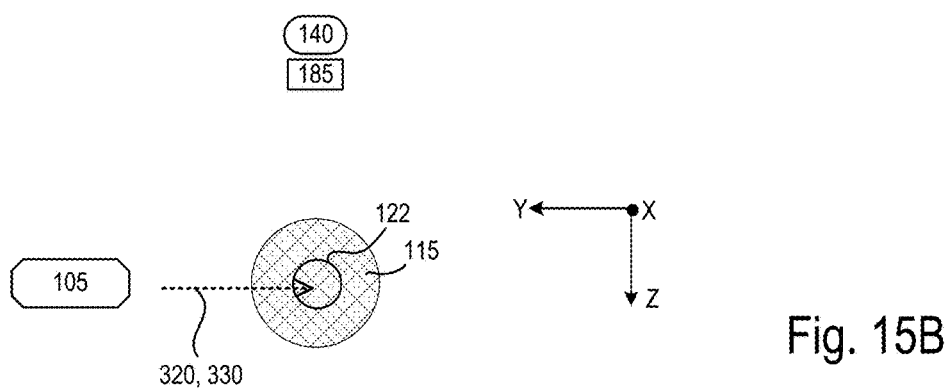
Figure 16A:
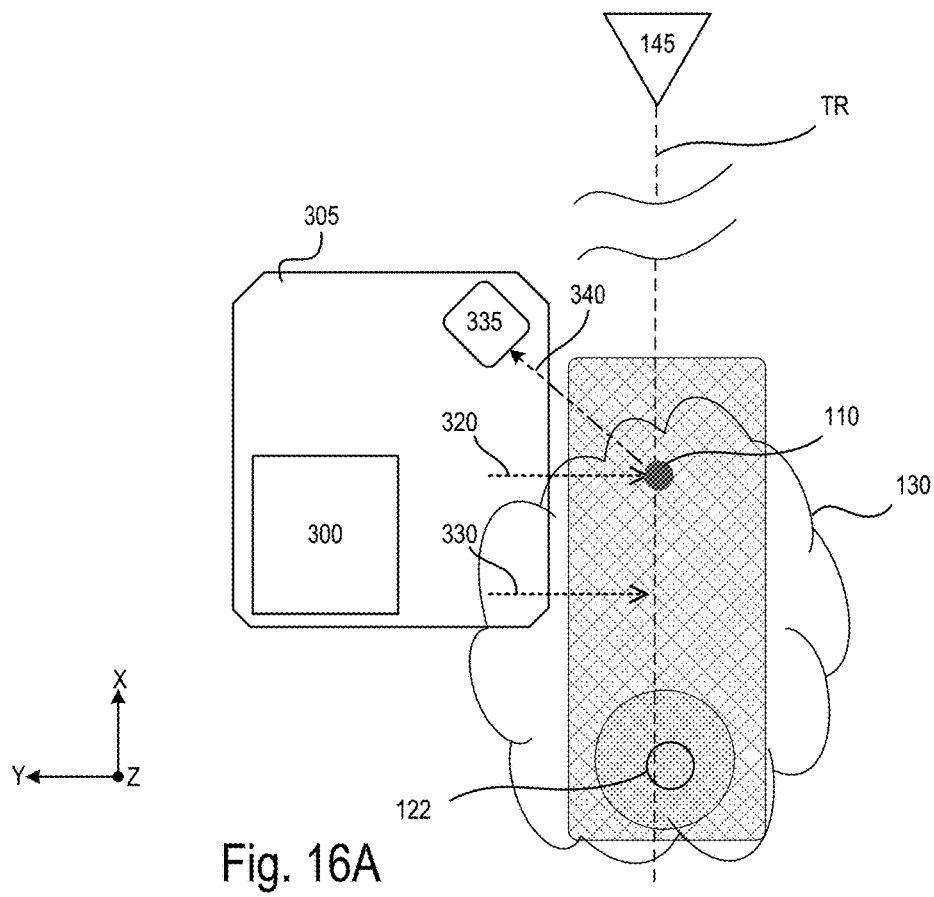
Figure 16B:
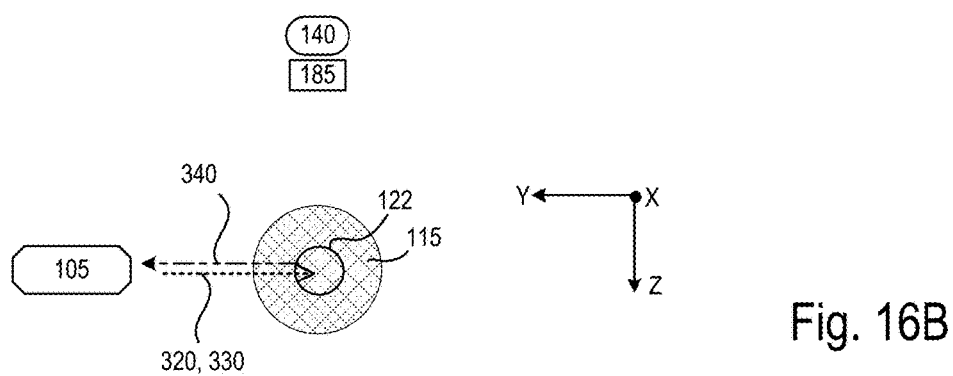
Figure 17A:
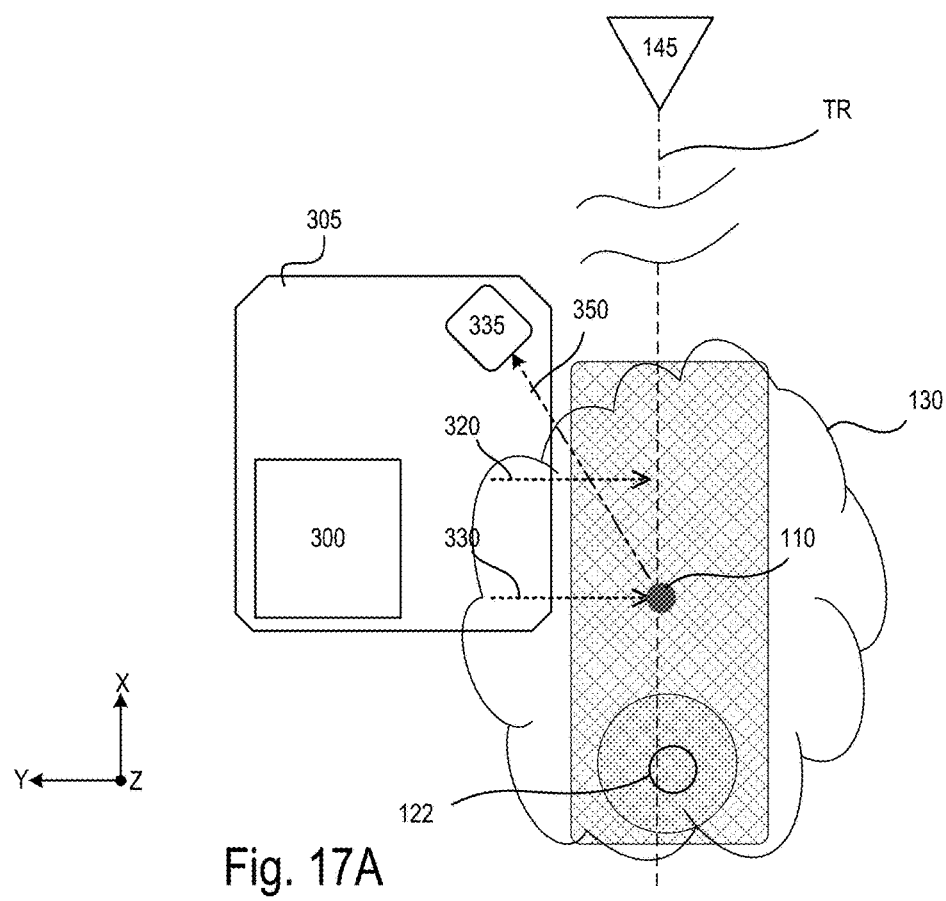
Figure 17B:
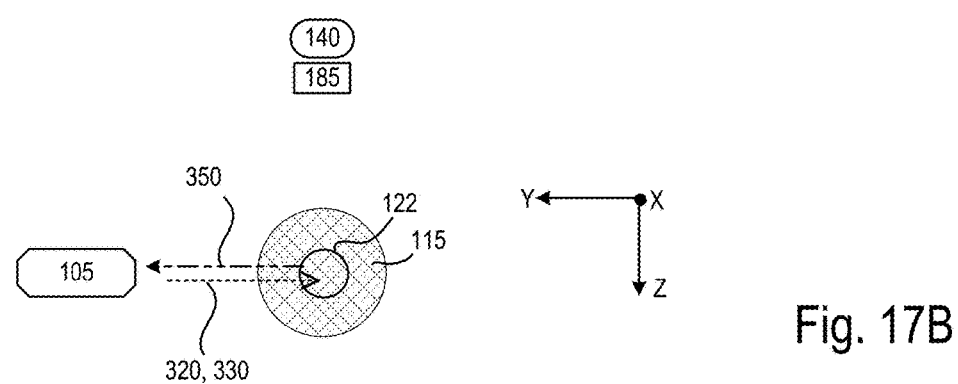
Figure 18A:
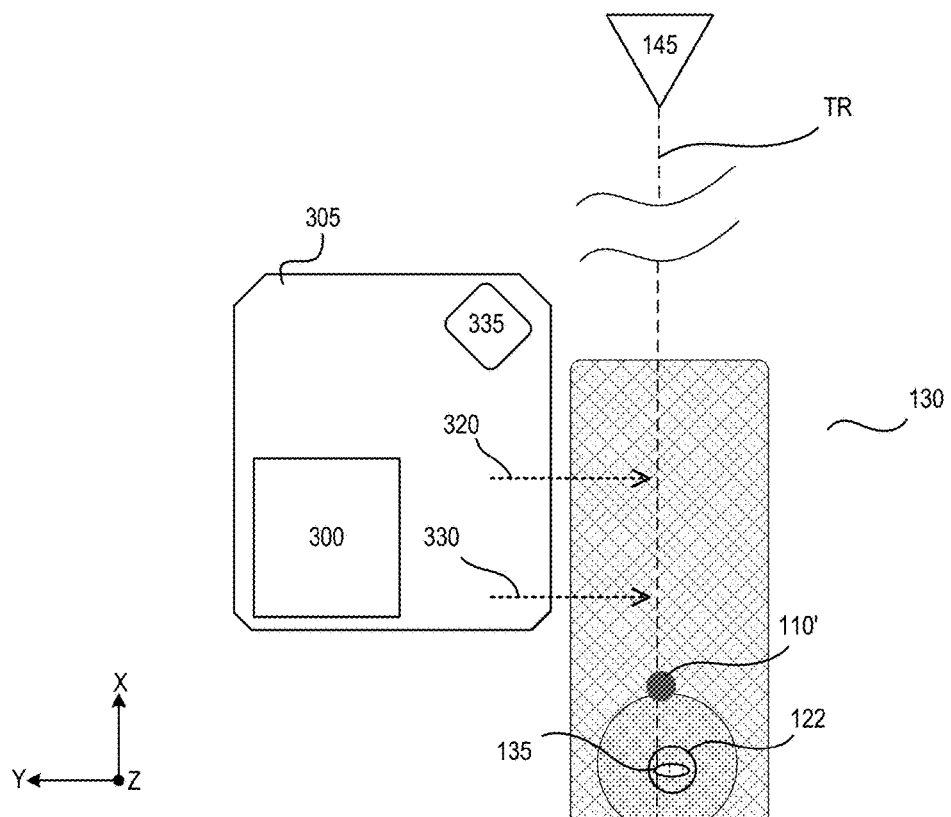
Figure 18B:
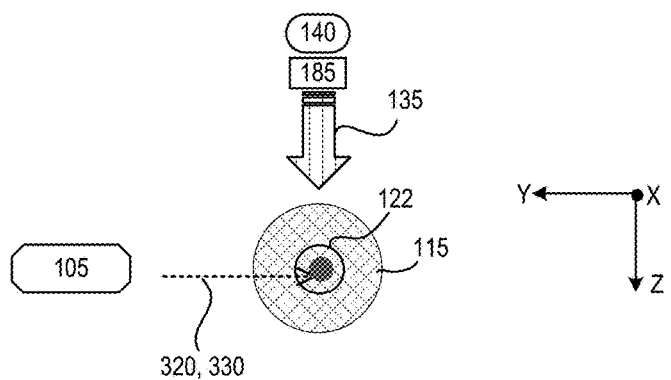
Figure 19A:
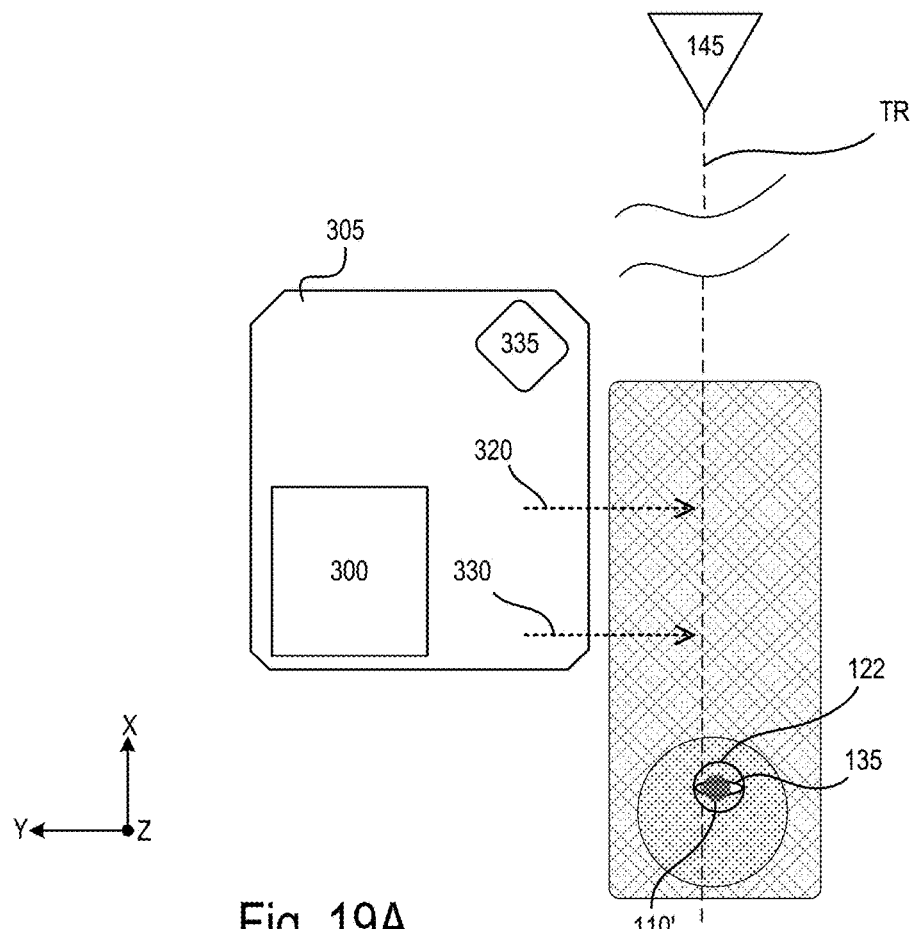
Figure 19B:
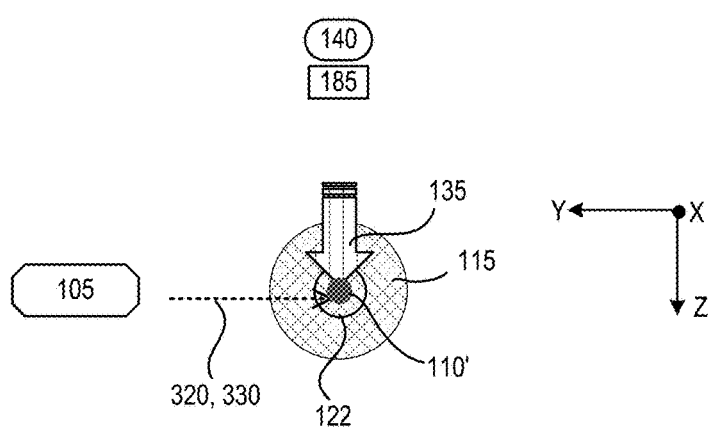
Figure 19C:
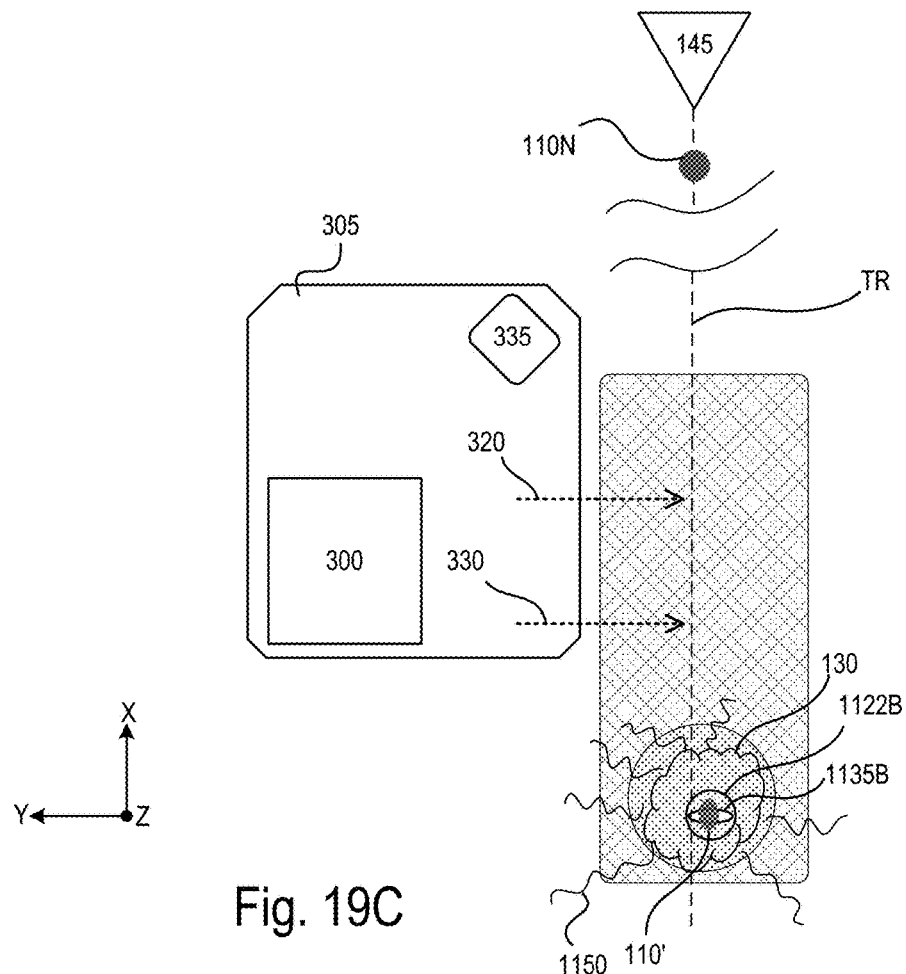
Figure 19D:
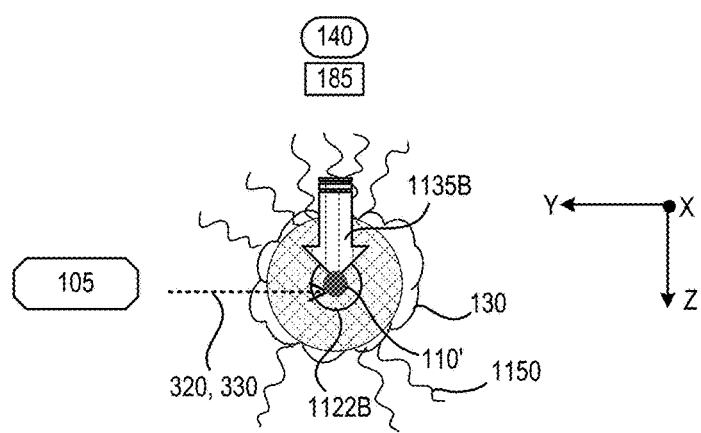
Figure 20A:
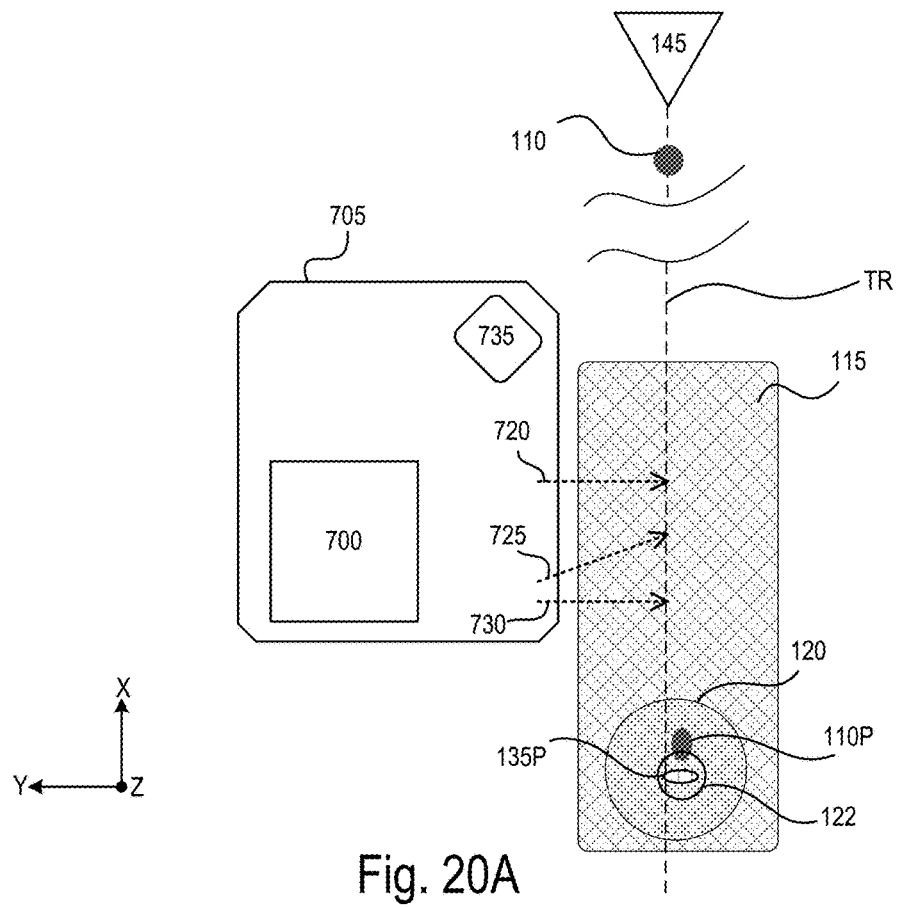
Figure 20B:
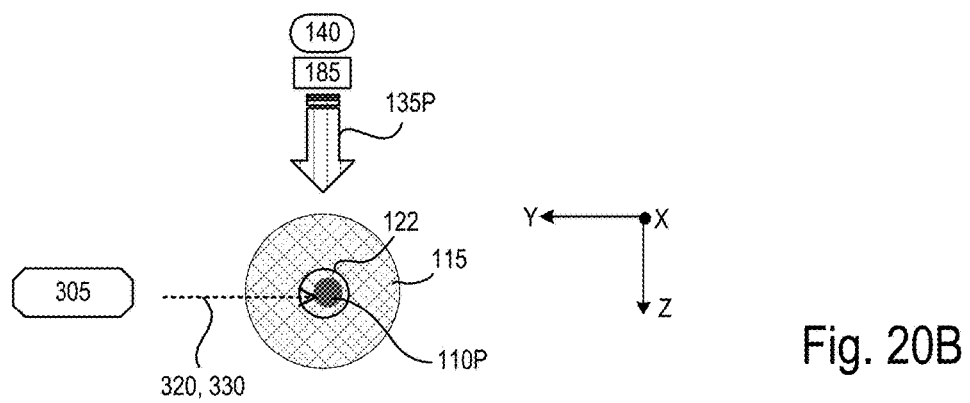

1, showing a point in time just before a prior radiation pulse and a prior target interact with each other at a target location within a target space;

FIG. 14B is a schematic diagram of the exemplary diagnostic system, extended target region, and target space of FIG. 14A as viewed along the X direction, showing the same point in time as FIG. 14A;

FIG. 15A is a schematic diagram of the exemplary diagnostic system, extended target region, and target space as viewed along the Z direction of the EUV light source of FIG. 1, showing a point in time just after the prior radiation pulse and the prior target interact with each other at the target location within the target space;

FIG. 15B is a schematic diagram of the exemplary diagnostic system, extended target region, and target space of FIG. 15A as viewed along the X direction, showing the same point in time as FIG. 15A;

FIG. 16A is a schematic diagram of the exemplary diagnostic system, extended target region, and target space as viewed along the Z direction of the EUV light source of FIG. 1, showing a point in time when the current target interacts with a first diagnostic light beam of the diagnostic system within the extended target region;

FIG. 16B is a schematic diagram of the exemplary diagnostic system, extended target region, and target space of FIG. 16A as viewed along the X direction, showing the same point in time as FIG. 16A;

FIG. 17A is a schematic diagram of the exemplary diagnostic system, extended target region, and target space as viewed along the Z direction of the EUV light source of FIG. 1, showing a point in time when the current target interacts with a second diagnostic light beam of the diagnostic system within the extended target region;

FIG. 17B is a schematic diagram of the exemplary diagnostic system, extended target region, and target space of FIG. 17A as viewed along the X direction, showing the same point in time as FIG. 17A;

FIG. 18A is a schematic diagram of the exemplary diagnostic system, extended target region, and target space as viewed along the Z direction of the EUV light source of FIG. 1, showing a point in time after the current target has interacted with the second diagnostic light beam in the extended target region and during which the current radiation pulse is being directed to the target space;

FIG. 18B is a schematic diagram of the exemplary diagnostic system, extended target region, and target space of FIG. 18A as viewed along the X direction, showing the same point in time as FIG. 18A;

FIG. 19A is a schematic diagram of the exemplary diagnostic system, extended target region, and target space of the EUV light source of FIG. 1 as viewed along the Z direction, showing a point in time during which the current target is interacting with the current radiation pulse in the target space;

FIG. 19B is a schematic diagram of the exemplary diagnostic system, extended target region, and target space of FIG. 19A as viewed along the X direction, showing the same point in time as FIG. 19A;

FIG. 19C is a schematic diagram of the exemplary diagnostic system, extended target region, and target space of the EUV light source of FIG. 1, as viewed along the Z direction, showing a point in time during which the current target is interacting with a current main radiation pulse in the target space and producing EUV light;

FIG. 19D is a schematic diagram of the exemplary diagnostic system, extended target region, and target space of FIG. 19C as viewed along the X direction, showing the same point in time as FIG. 19C;

FIG. 20A is a schematic diagram of an exemplary diagnostic system, extended target region, and target space as viewed along the Z direction of the EUV light source of FIG. 1, showing a point in time after a current target has interacted with three diagnostic light beams of the diagnostic system in the extended target region and during which the current radiation pulse is being directed to the target space; and FIG. 20B is a schematic diagram of the exemplary diagnostic system, extended target region, and target space of FIG. 20A as viewed along the X direction, showing the same point in time as FIG. 20A.

DESCRIPTION

Figure 1A:
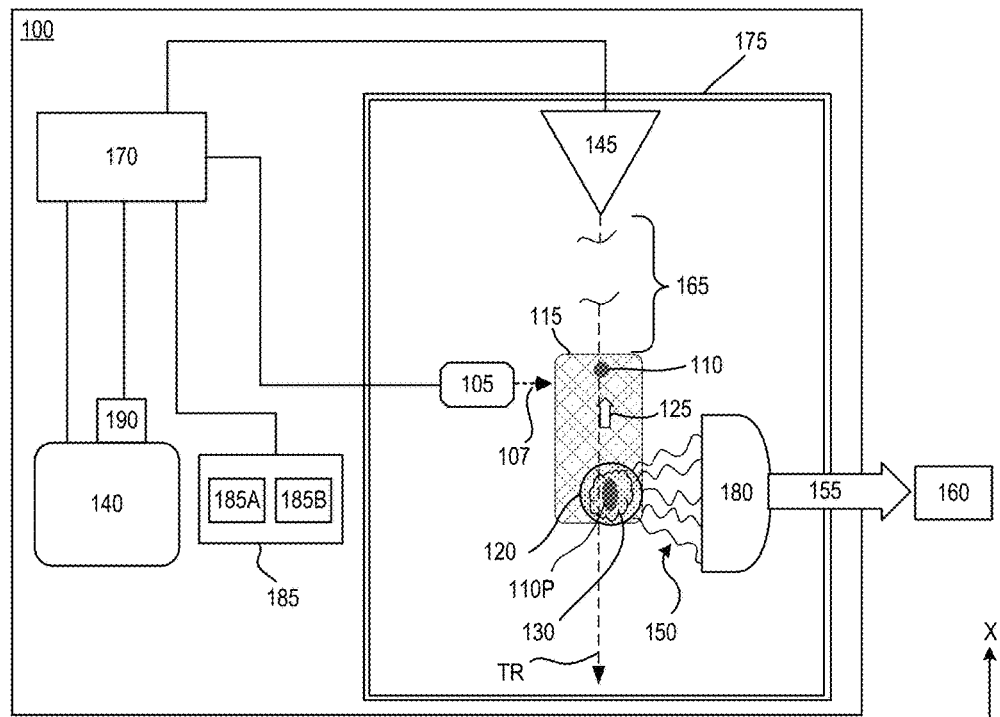
FIG. 1A is a block diagram of a laser produced plasma extreme ultraviolet light source including a diagnostic system for detecting a moving property of a target traveling in an extended target region toward a target space along the –X direction.
Figure 1B:
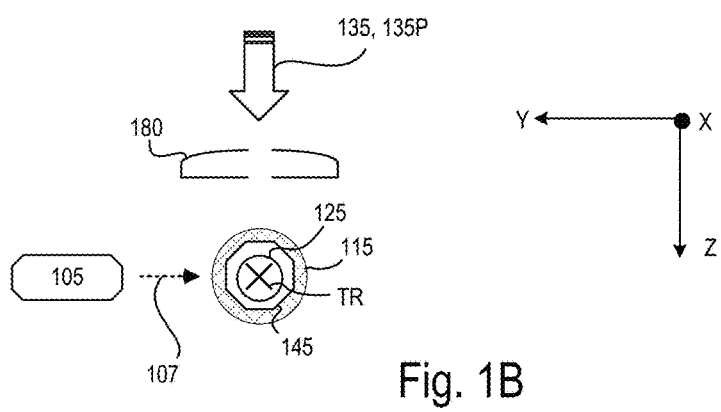
FIG. 1B is a schematic diagram showing a view of the light source of FIG. 1A in which the X direction is coming out of the page and the target trajectory is into the page.

Referring to FIGS. 1A and 1B, an extreme ultraviolet (EUV) light source 100 supplies EUV light 155 that has been produced by an interaction between a target and a radiation pulse to an output apparatus 160. The EUV light source 100 includes features or components that measure and analyze one or more moving properties (such as speed, velocity, and acceleration) of a current target 110 as the current target 110 travels in an extended target region 115. The current target 110 travels generally along a trajectory TR, the direction of which can be considered as a target (or axial) direction $A_T$, toward a target space 120 that is defined within a chamber 175. The axial direction $A_T$ of the current target 110 lies in a three dimensional coordinate system, that is, the X, Y, Z coordinate system defined by the chamber 175. The axial direction $A_T$ of the current target 110 generally has a component that is parallel with the −X direction of the coordinate system of the chamber 175. However, the axial direction $A_T$ of the current target 110 also can have components along one or more of the directions Y and Z that are perpendicular to the −X direction.

Figure 2A:
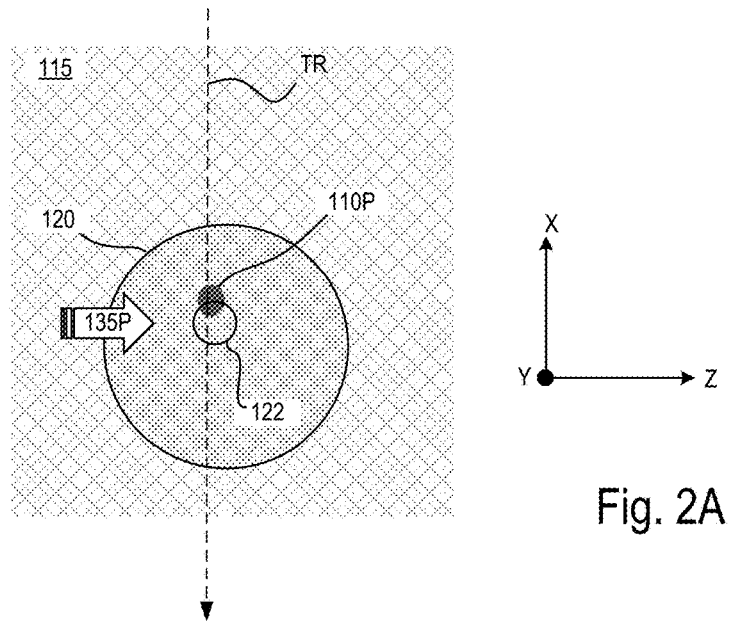
FIG. 2A is a schematic diagram showing a point in time just before a prior radiation pulse and a prior target interact with each other at a target location within a target space of the EUV light source of FIG. 1.
Figure 2B:
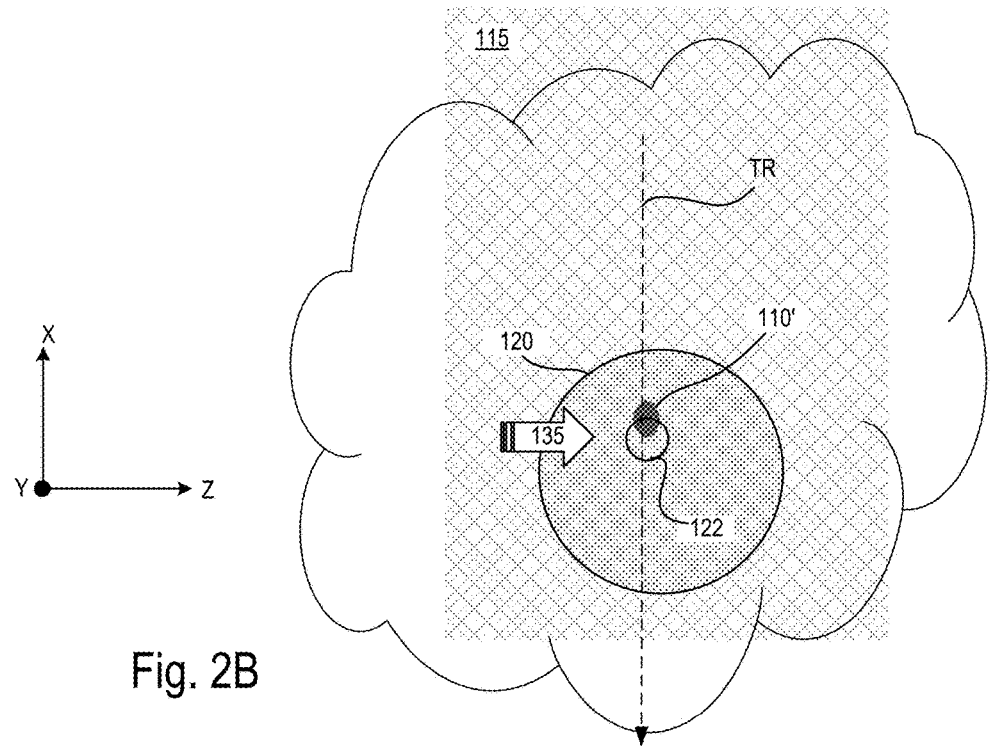
FIG. 2B is a schematic diagram showing a point in time just before a current radiation pulse and a current target interact with each other at the target location within the target space of the EUV light source of FIG. 1.

With reference to FIGS. 1B and 2B, the EUV light source 100 adjusts one or more characteristics of a radiation pulse 135 that is directed toward the target space 120 based on the analysis of the determined moving property of the current target 110. The adjustment to the one or more characteristics of the radiation pulse 135 improves a relative alignment between a present target 110' and the radiation pulse 135 at the target location 122 in the target space 120. The present target 110' is the target that has entered the target space 120 at the time that the radiation pulse 135 (which has just been adjusted) arrives in the target space 120. Such adjustment to the one or more characteristics of the radiation pulse 135 improves the interaction between the present target 110' and the radiation pulse 135 and increases the amount of EUV light 150 (such as shown in FIG. 1A) produced by such interaction.

In some implementations, the present target 110' is the current target 110. In these implementations, the adjustment to the one or more characteristics of the radiation pulse 135 happens in a relatively shorter time frame. A relatively shorter time frame means that the one or more characteristics of the radiation pulse 135 are adjusted during the time after the analysis of the moving properties of the current target 110 is completed to the time that the current target 110 enters the target space 120. Because the one or more characteristics of the radiation pulse 135 are able to be adjusted in the relatively shorter time frame, there is enough time to effect the interaction between the current target 110 (the moving properties of which have just been analyzed) and the radiation pulse 135.

In other implementations, the present target 110' is another target, that is, a target other than the current target 110, and following the current target 110 in time. In these implementations, the adjustment to the one or more characteristics of the radiation pulse 135 happens in a relatively longer time frame such that it is not feasible to effect the interaction between the current target 110 (the moving properties of which have just been analyzed) and the radiation pulse 135. On the other hand, it is feasible to effect the interaction between the other (or later) target and the radiation pulse 135. A relatively longer time frame is a time frame that is greater than the time after the analysis of the moving properties of the current target 110 is completed to the time that the current target 110 enters the target space 120. Depending on the relatively longer time frame, the other target could be adjacent to the current target 110. Or, the other target could be adjacent to an intermediate target that is adjacent to the current target 110.

The EUV light source 100 is able to determine the moving property of the current target 110 and each target directed toward the target space 120, and also to adjust the characteristic (or characteristics) of the radiation pulse 135 in a short window of time. Specifically, the moving property of the current target 110 is determined after a prior and adjacent target 110P has interacted with a prior radiation pulse 135P (FIG. 2A) but before the next target enters the extended target region 115. In this way, the moving property of every or nearly every target that is being directed to the target space 120 can be determined so that a specific adjustment to a particular radiation pulse can be tailored to the determined moving property of the target that the particular radiation pulse will interact with.

By measuring and analyzing the moving property of the current target 110 in this extended target region 115 and in the short window of time, it is possible determine the impact or effect of various forces and effects applied to the current target 110 as it travels toward the target space 120. For example, forces and effects that are applied to the current target 110 include plasma pushback forces 125 that are applied to the current target 110 due to the remaining plasma 130 that is formed from an interaction at the target location 122 within the target space 120 between the prior target 110P (shown in FIG. 2A) and the prior radiation pulse 135P (shown in FIG. 2A) that is supplied by an optical source 140. Such plasma pushback forces 125 can become larger as the plasma power increases, and the plasma power depends on power of the prior radiation pulse 135P and the efficiency of the interaction between the prior radiation pulse 135P and the prior target 110P. Thus, it becomes important as these output powers are increased to account for and make adjustments to reduce the impact of the plasma pushback forces 125. Other forces and effects applied to the current target 110 include instabilities in the generation and transport of the current target 110 as it travels toward the target space 120 and disruptions to the target trajectory due to the current target 110 interacting with other gas flow (such as hydrogen gas) as it travels toward the target space 120.

The current target 110 (as well as the prior target 110P and targets released earlier and later than these targets) is produced by a target delivery system 145 and is directed toward the target space 120 along a trajectory or path TR and the current target 110 is directed along its own axial direction $A_T$ each point along the trajectory TR. In some implementations, the axial direction $A_T$ of the current target 110 upon immediate release from the target delivery system 145, aligns or is parallel with the –X direction of the three dimensional coordinate system X, Y, Z. The current target 110 moves at a velocity and along its axial direction $A_T$ and such motion can be predicted based on the properties at the target delivery system 145. Each target released by the target delivery system 145 can have a slightly different actual trajectory and the trajectory depends on the physical properties of the target delivery system 145 at the time of release of the target as well as the environment within the chamber 175.

However, as discussed above, various forces and effects (such as the plasma pushback forces 125 applied along the X direction as well the Y and Z directions) applied to the current target 110 can cause the motion of the current target 110 to divert or change from the predicted motion. For example, the plasma pushback forces 125 can slow the current target 110 (as well as the present target 110') along the X direction or cause the current target 110 to move along the Y or Z directions in an unpredictable manner. Without taking into account the impact of these forces and effects (such as the plasma pushback forces 125) on the movement of the present target 110' (which can be the current target 110), the radiation pulse 135 produced by the optical source 140 and directed toward the target location 122 within the target space 120 may miss the present target 110' completely or may not efficiently interact with the present target 110' when the present target 110' reaches the target location 122. This inefficient interaction can lead to a reduction in the amount of EUV light 150 produced by the present target 110', and thus can lead to a reduction in the amount of EUV light 155 that is output from the light source 100 toward an output apparatus 160 such as a lithography exposure apparatus. Additionally, this inefficient interaction can produce excess debris from the material of the present target 110' after it has interacted with the radiation pulse 135. This debris contaminates an interior of or optics within the chamber 175, and the contamination of the chamber interior and/or optics within the chamber 175 can force stoppage of the EUV light source 100 in order to clean the interior and/or optics or to replace optics.

The current target 110 can experience plasma pushback forces 125 that change its velocity (an exemplary moving property), for example, on the order of 0.1 to 10 m/s. To resolve such a change to the velocity of the current target 110, the EUV light source 100 should be able to detect changes in the velocity to within a level that can be less than or equal to about 0.1 m/s (for example, less than or equal to about 0.04 m/s or 0.02 m/s) to ensure an acceptable accuracy in a relative position between the radiation pulse and the present target 110' at the target location 122, for example, a relative position of less than 5 µm.

Referring again to FIG. 1A, the extended target region 115 is that region in which the plasma pushback forces 125 affect the current target 110 and cause the motion of the current target 110 to deviate from a desired motion. By quantifying this deviation, it is possible to determine how to adjust the radiation pulse 135 to ensure that the radiation pulse 135 efficiently interacts with the present target 110' within the target space 120. If the present target 110' is a target other than the current target 110, then an assumption can be made that the effect of the various forces on the current target 110 is similar to the effect of the various forces on the present target 110' so that the analysis can be applied to adjust the radiation pulse 135 that interacts with the target other than the current target 110.

The extended target region 115 therefore can include remaining plasma 130 formed from the interaction of the prior target 110P (as shown in FIG. 2A) and the prior radiation pulse 135P (as shown in FIG. 2A). A first region 165 between the extended target region 115 and the target delivery system 145 can be considered as a region in which the plasma pushback forces 125 have a much lower effect on the current target 110. Thus, it is expected that a moving property (such as a speed or direction) of the current target 110 in the extended target region 115 will be different from the moving property of the current target 110 in the first region 165. Such a difference may make it difficult to efficiently interact the radiation pulse 135 with the present target 110' when it reaches the target location 122 within the target space 120 because the present target 110' may arrive at a different location than planned within the target space 120 and thus the radiation pulse 135 may not fully or partly intercept the present target 110'.

In order to measure the moving property of the current target 110, the EUV light source 100 includes a diagnostic system 105 that provides one or more diagnostic probes 107 that interact with the current target 110 in the extended target region 115, as shown in FIG. 1A. Specifically, the one or more diagnostic probes 107 interact with the current target 110 in the extended target region 115 only after the prior and adjacent target 110P has already interacted with the prior radiation pulse 135P in the target space 120. The one or more diagnostic probes 107 can be directed along a direction that is in a plane of the −X direction and the −Y direction, for example, along the −Y direction. Moreover, the one or more diagnostic probes 107 can be configured to interact with each and every target 110 that passes through the extended target region 115 so that the diagnostic system 105 analyzes information about each and every target 110.

The interaction between the current target 110 and the one or more diagnostic probes 107 releases information (such as light or photons) that can be detected by the diagnostic system 105. The diagnostic system 105 outputs data based on the released information, and that data can be used to determine the moving property of the current target 110. The EUV light source 100 also includes a control system 170 that receives this data from the diagnostic system 105. The control system 170 analyzes this data and determines the moving property of the current target 110 based on this analysis.

The EUV light source 100 performs the measurement and analysis on the moving property of the current target 110 in the extended target region 115 and also makes a change to one or more characteristics of the radiation pulse 135 that will interact with the present target 110' at the target location 122 within the target space 120 so that the present target 110' and the radiation pulse 135 efficiently interact with each other to produce EUV light 150. The radiation pulse 135 that interacts with the present target 110' at the target location 122 within the target space 120 may or may not be the very next radiation pulse that is produced by the optical source 140 after the production of the prior radiation pulse 135P.

The time frame during which the EUV light source 100 performs the measurement and analysis as well as the adjustment or change to the radiation pulse 135 is constrained by one or more of the rate at which the target delivery system 145 generates and releases each target along the trajectory TR and a distance between the target delivery system 145 and the target space 120. For example, if the target delivery system 145 generates targets at a repetition rate of 50 kHz, and a velocity of a target is 70 meters per second (m/s) as it is released from the target delivery system 145, then each target in the trajectory TR is physically separated or spaced by about 1.4 millimeters (mm) along the trajectory TR. Given these exemplary conditions, each target crosses the path of the diagnostic probe(s) 107 of the diagnostic system 105 every 20 microseconds (µs). In this example, the EUV light source 100 must perform the measurement and analysis on the current target 110 as well as affect the change to the radiation pulse 135 all within a time frame of 20 µs just after the prior target 110P and the prior radiation pulse 135P interact, and also within distances that are less than the spacing between the targets (which would be 1.4 mm in this example).

The plasma pushback forces 125 extend out from the target space 120 and the size of the forces drop with the distance from the target space 120. For example, the plasma pushback forces 125 can drop with a linear multiple of the distance or with a square of the distance. For example, the plasma pushback forces 125 generated within the target space 120 can affect the current target 110 as far out as 1.0 to 1.5 mm or even up to 10 mm from the target space 120 along any of the directions, and for example, along the X direction. By contrast, the distance between the target space 120 and the target delivery system 145 is about 1 meter (m).

The EUV light source 100 includes the chamber 175 that defines the target space 120, the first region 165, and the extended target region 115, which is closer to the target space 120 than the first region 165, all within the three dimensional coordinate system X, Y, Z. The target delivery system 145 is configured to release the current target 110 along the trajectory or path TR that overlaps both the first region 165 and the extended target region 115. As discussed above, the target delivery system 145 releases a stream of targets at a particular rate, and the EUV light source 100 must take this rate into account when determining the total amount of time needed to perform the measurement and analysis on the moving property (or properties) of the current target 110 as well as affecting a change to the radiation pulse 135 that interacts with the present target 110' at the target location 122 within the target space 120.

The EUV light source 100 includes a light collector 180 that collects as much EUV light 150 emitted from the plasma as possible and redirects that EUV light 150 as collected EUV light 155 toward the output apparatus 160.

The EUV light source 100 includes a beam delivery system 185 that directs the beam of radiation pulse or pulses 135P, 135 from the optical source 140 to the target space 120 and generally along the Z direction (though the beam or beams 135, 135P can be at an angle relative to the Z direction). The beam delivery system 185 can include optical steering components 185A that change a direction or angle of the beam of radiation pulses 135, 135P and a focus assembly 185B that focuses the beam of radiation pulses 135, 135P to the target space 120. Exemplary optical steering components 185A include optical elements such as lenses and mirrors that steer or direct the beam of radiation pulses by refraction or reflection, as needed. The beam delivery system 185 can also include an actuation system that controls or moves the various features of the optical components 185A and the focus assembly 185B.

Each of the targets (such as the present target 110' the current target 110, the prior target 110P, and all other targets produced by the target delivery system 145) includes a material that emits EUV light when converted to plasma. Each target is converted at least partially or mostly to plasma through interaction with the radiation pulse 135 produced by the optical source 140 at the target location 122 within the target space 120.

Each target (including the current target 110 and the prior target 110P) produced by the target delivery system 145 is a target mixture that includes a target substance and optionally impurities such as non-target particles. The target substance is the substance that is capable of being converted to a plasma state that has an emission line in the EUV range. The target substance can be, for example, a droplet of liquid or molten metal, a portion of a liquid stream, solid particles or clusters, solid particles contained within liquid droplets, a foam of target material, or solid particles contained within a portion of a liquid stream. The target substance can include, for example, water, tin, lithium, xenon, or any material that, when converted to a plasma state, has an emission line in the EUV range. For example, the target substance can be the element tin, which can be used as pure tin (Sn); as a tin compound such as SnBr4, SnBr2, SnH4; as a tin alloy such as tin-gallium alloys, tin-indium alloys, tin-indium-gallium alloys, or any combination of these alloys. In the situation in which there are no impurities, then each target includes only the target substance. The discussion provided herein is an example in which each target is a droplet made of molten metal such as tin. However, each target produced by the target delivery system 145 can take other forms.

The current target 110 can be provided to the target space 120 by passing molten target material through a nozzle of the target delivery system 145, and allowing the current target 110 to drift into the target space 120. In some implementations, the current target 110 can be directed to the target space 120 by force. The current target 110 can be a material that has already interacted with one or more radiation pulses 135 or the current target 110 can be a material that has not yet interacted with one or more radiation pulses 135.

The optical source 140 is configured to produce a plurality of radiation pulses that are directed toward the target space 120 by way of the beam delivery system 185. Each radiation pulse that interacts with a target at the target location 122 within the target space 120 converts at least a part of that target into plasma that emits EUV light 150.

The EUV light source 100 also includes an adjustment system 190 coupled to the optical source 140 and to the control system 170. The control system 170 is configured to control a relative position between a radiation pulse 135 and the present target 110' by sending a control signal to the adjustment system 190. The control signal causes the adjustment system 190 to adjust one or more of a timing of a release of the radiation pulse 135 and a direction at which the radiation pulse 135 travels.

Figure 3:
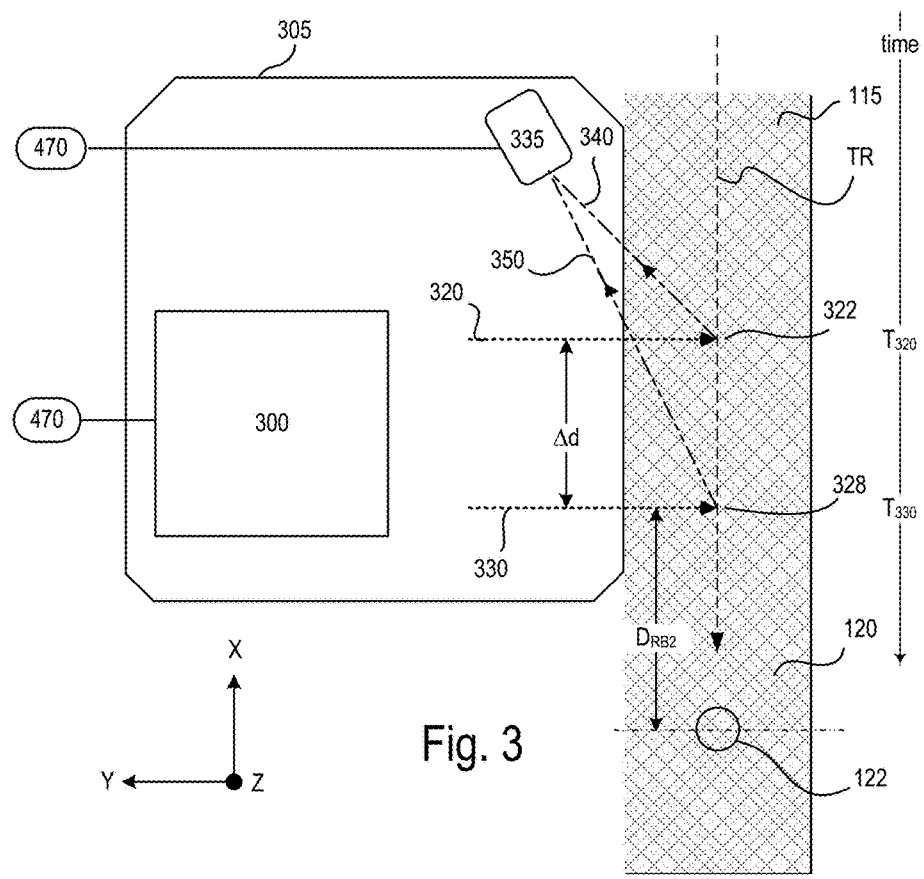
FIG. 3 is a block diagram of an exemplary diagnostic system of the EUV light source of FIG. 1.

Referring to FIG. 3, an exemplary diagnostic system 305 is shown. The diagnostic system 305 includes a probe module 300 which can be an illumination module 300 that produces, under control of the control system 170 or control system 470 (discussed below), as the diagnostic probe 107 at least two diagnostic light beams 320, 330 that are directed toward the trajectory TR of the current target 110. As discussed above, the diagnostic probe 107 (in this case, the diagnostic light beams 320, 330) interacts with the current target 110 in the extended target region 115. Accordingly, the diagnostic light beam 320 is directed to interact with the current target 110 at a location 322 and a time $T_{320}$ in the extended target region 115, and the diagnostic light beam 330 is directed to interact with the current target 110 at a location 328 and at a time $T_{330}$ in the extended target region 115. The time $T_{330}$ is after the time $T_{320}$. The diagnostic light beams 320, 330 form laser curtains through which the current target 110 traverses. In some implementations, such as shown in FIG. 3, the diagnostic light beams 320, 330 can be directed along a path that crosses the trajectory TR at a right angle (an angle of approximately 90°) to the −X direction.

Moreover, the diagnostic light beams 320, 330 are separated from each other along the X direction by a known distance, for example, a value that can be referred to as Δd. For example, separation Δd can be less than the spacing between the targets and it can be determined or set based on the spacing between the targets to provide for greater precision in the measurements that are performed based on the interactions between the diagnostic light beams 320, 330 and the current target 110. Up to a point and in general, the larger the separation Δd the higher the precision in the measurements that are performed. For example, the separation Δd can be between about 250 µm and 800 µm.

The interactions between the diagnostic light beams 320, 330 and the current target 110 enable the control system 170 or 470 to determine a moving property such as a velocity V of the current target 110 along the −X direction. It is possible to determine trends in the velocity V or the changing velocity V over many targets. It is also possible to determine a change in a moving property of the current target 110 along the −X direction using only the diagnostic light beams 320, 330 if some assumptions about the motion of the current target 110 are made.

Figure 5:
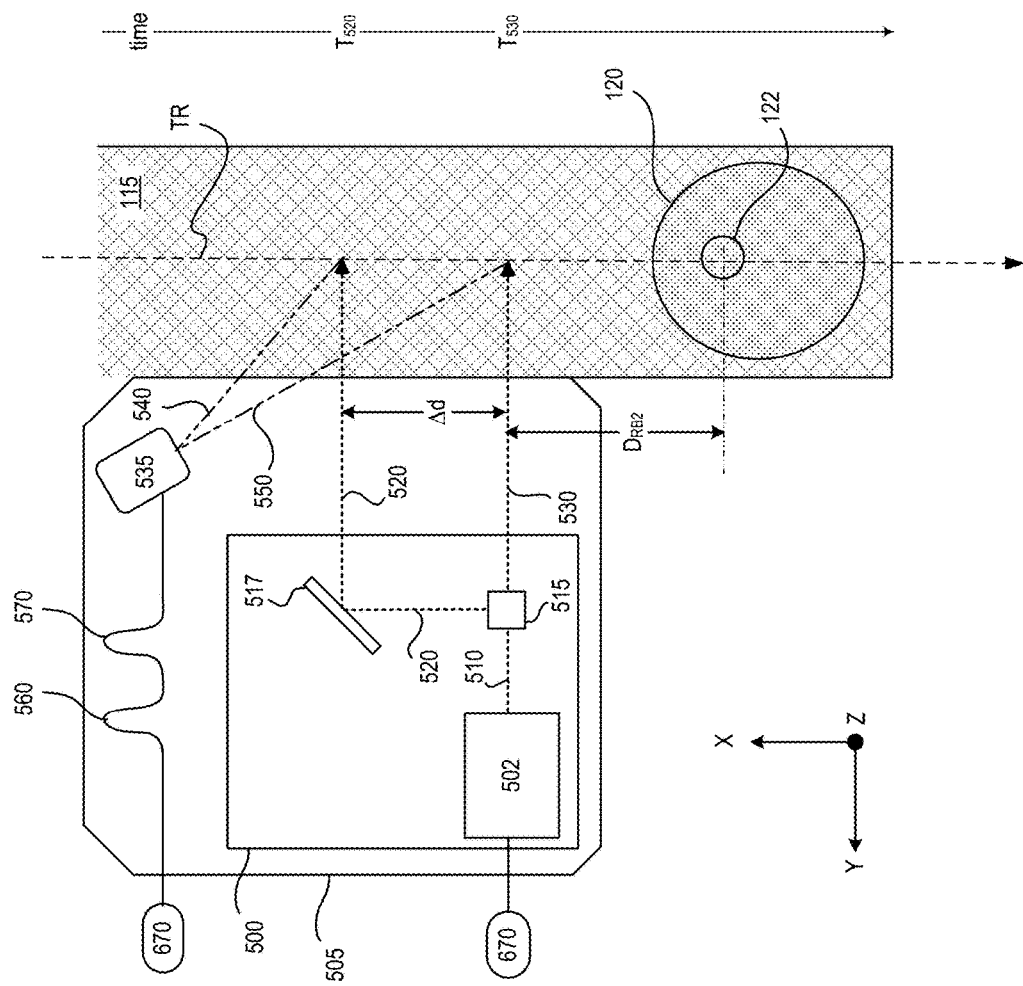
FIG. 5 is a block diagram of an exemplary diagnostic system of the EUV light source of FIG. 1.

In some implementations, the illumination module 300 includes a single light source that produces a light beam that is split into two diagnostic light beams (such an exemplary design is shown in FIG. 5). For example, a single light source can be a solid-state laser such as a YAG laser, which can be a neodymium-doped YAG (Nd:YAG) laser operating at 1070 nm and at 50 W power. In this example, the illumination module 300 also includes one or more optical elements (such as a beam splitter or mirrors) that split the light beam from the YAG laser into two separate diagnostic light beams that are directed toward the trajectory TR of the target 110 as diagnostic light beams 320, 330. In other implementations, the illumination module 300 includes a pair of light sources such as two lasers, each producing its own diagnostic light beam 320, 330.

The diagnostic system 305 also includes a detection module 335. The detection module 335 is configured to detect the data that results from the interaction between the current target 110 and the respective diagnostic light beam 320, 330 within the extended target region 115, and then output the detected data to the control system 170 or 470. For example, the detection module 335 can detect each interaction by detecting a one-dimensional aspect or characteristic such as the intensity of the light 340, 350 that is reflected from the current target 110 as the respective diagnostic light beam 320, 330 strikes the target 110. Moreover, the control system 170 or 470 can analyze the data from the detection module 335 and, based on the analysis, detect the time at which the maximum intensity of the light 340, 350 that is reflected from the current target 110 reaches the detection module 335. The light 340, 350 that is reflected from the current target 110 can be a portion of the respective diagnostic light beam 320, 330 that is reflected from the current target 110. The accuracy with which the EUV light source 100 can detect the changes to the trajectory of the current target 110 is limited to the resolution of the detection module 335.

In some implementations, the detection module 335 includes a photo detector and one or more optical components such as reflective or refractive optics, filters, apertures to direct and modify the light 340, 350 prior to entering the photo detector.

The wavelength of the diagnostic probe (and the diagnostic light beams 320, 330) produced by the illumination module 300 should be distinct enough from the wavelength of the radiation pulses 135 produced by the optical source 140 so that the detection module 335 can distinguish between the light 340, 350 reflected from the current target 110 and stray light from the radiation pulses 135. In some implementations, the wavelength of the diagnostic light beams 320, 330 is 532 nm or 1550 nm.

It is also possible that the diagnostic system 105, 305 includes an optic that changes a polarization state of one or more of the diagnostic light beams 320, 330.

Figure 7:
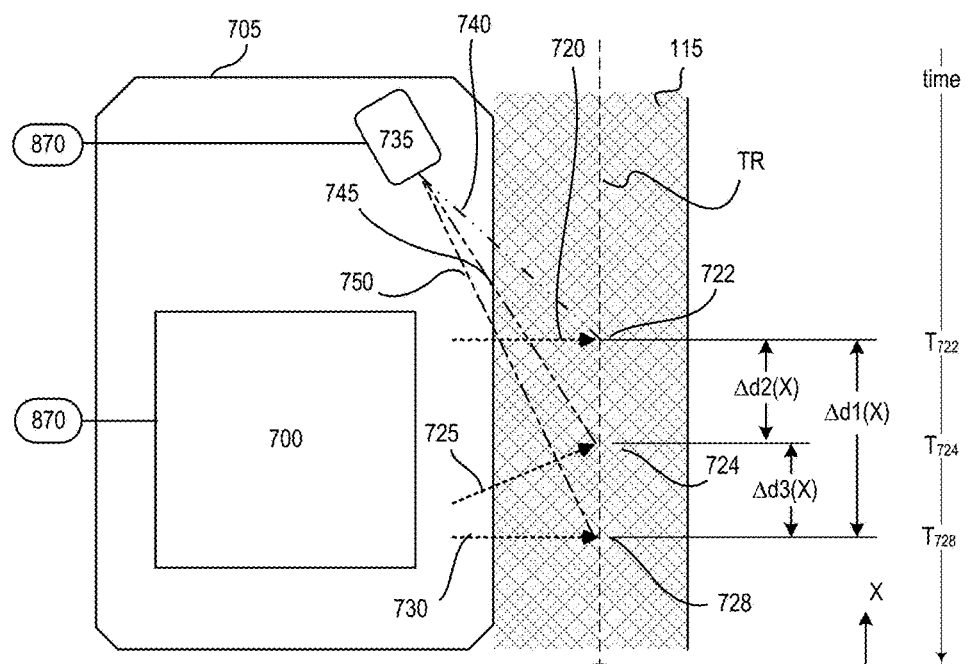
FIG. 7 is a block diagram of an exemplary diagnostic system of the EUV light source of FIG. 1.

In some implementations, the diagnostic light beams 320, 330 produced by a laser source are Gaussian beams, and thus the transverse profile of the optical intensity of each diagnostic light beam 320, 330 can be described with a Gaussian function. In such a function, the optical intensity correlates with the transverse distance from the axis of the light beam 320 or 330. The transverse profile of the diagnostic light beam 320, 330 also determines how the detection module 335 measures the light 340, 350 reflected from the current target 110 because the different transverse profiles of the diagnostic light beam 320, 330 can alter one or more aspects of the light 340, 350 detected by the detection module 335. The transverse profile of the diagnostic light beam 320 or 330 could be used to determine a moving property of the current target 110 that has a component in the Y direction if the diagnostic light beam 320, 330 were to be directed along a path that subtends a non-right angle with the trajectory TR of the current target 110, such as shown in FIG. 7.

Figure 4:
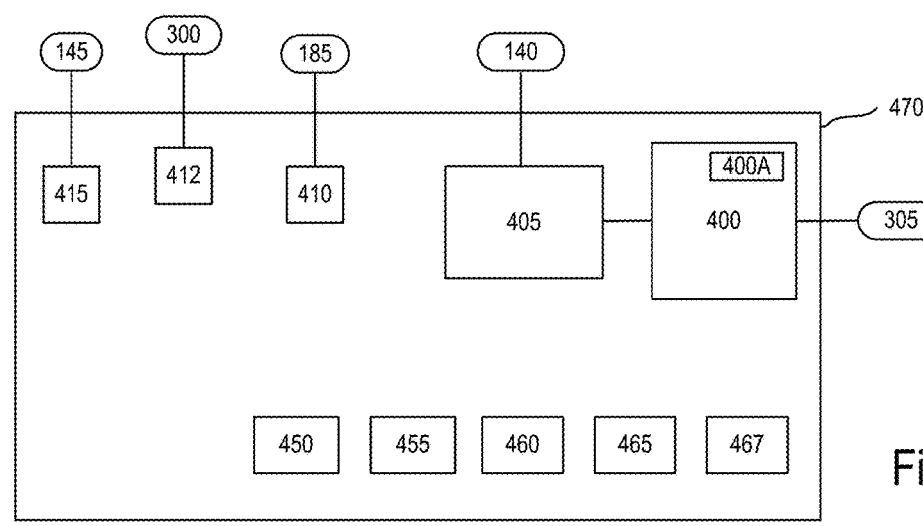
FIG. 4 is a block diagram of an exemplary control system of the EUV light source of FIG. 1.

The control system 170 or 470 is configured to analyze the data output from the diagnostic system 105, 305 and control a relative position between the radiation pulse 135 and the present target 110' based on the analysis. To this end, and with reference to FIG. 4, an exemplary control system 470 includes a detection sub-controller 400 that receives the output from the diagnostic system 305. The detection sub-controller 400 analyzes the output from the detection module 335 of the diagnostic system 305, and determines one or more moving properties of the current target 110 based on this analysis. The detection sub-controller 400 also determines whether an adjustment needs to be made to the radiation pulse 135 output from the optical source 140 based on this determination; and if an adjustment is needed, the detection sub-controller 400 sends an appropriate signal to an optical source sub-controller 405, which interfaces with the optical source 140.

In some implementations, the detection module 335 of the diagnostic system 305 outputs a one-dimensional signal such as a voltage signal that is generated when photons of the light 340, 350 are detected. Thus, the detection module 335 detects a one-dimensional aspect (such as the photons) of the light 340, 350. The detection sub-controller 400 converts the output (such as the voltage signal) from the detection module 335 into a value associated with the light 340 produced from the interaction between the current target 110 and the diagnostic light beam 320, and a value associated with the light 350 produced from the interaction between the current target 110 and the diagnostic light beam 330. These two values can be used to determine the one or more moving properties of the target 110.

For example, the detection sub-controller 400 can convert the voltage signal from the detection module 335 into a first value that corresponds to a maximum intensity of the light 340 produced from the interaction between the current target 110 and the diagnostic light beam 320, and a second value that corresponds to the maximum intensity of the light 350 produced from the interaction between the current target 110 and the diagnostic light beam 330. These two values of the maximum intensity can be digitally time stamped and then used to determine the one or more moving properties of the target 110, as discussed below in greater detail.

The sub-controller 400 can include a field-programmable hardware circuit 400A, such as a field-programmable gate array (FPGA), which is an integrated circuit designed to be configured by a customer or a designer after manufacturing. The circuit 400A can be dedicated hardware that receives the values of the time stamps from the detection module 335, performs a calculation on the received values, and uses one or more lookup tables to estimate a time of arrival of the present target 110' at the target location 122. In particular, the circuit 400A can be used to quickly perform a calculation to enable the adjustment to the one or more characteristics of the radiation pulse 135 in the relatively shorter time frame to enable the adjustment of the one or more characteristics of the radiation pulse 135 that interacts with the current target 110, the moving properties of which have just been analyzed by the circuit 400A.

For example, the circuit 400A can perform a subtraction step on the time stamps to determine the value of the difference $\Delta T$. The circuit 400A accesses the stored the values of the separation $\Delta d$, and the value of the distance $D_{RB2}$ between the crossing of the diagnostic light beam 330 with the trajectory TR of the current target 110 and the target location 122 along the X direction. The circuit 400A can therefore rapidly perform a calculation using a simple and fast technique that does not require the use of other software within the sub-controller 400 or within other components of the control system 470. For example, the circuit 400A can access a flight time lookup table that stores a set of velocities V for specific values of the difference $\Delta T$ given the value of the separation $\Delta d$, and a set of times of arrival to the target location 122 that correlate with various values of $D_{RB2}$ divided by velocity V to quickly output the time of arrival to the sub-controller 400, for use by other components of the control system 470.

The control system 470 also includes a sub-controller 410 specifically configured to interface with the beam delivery system 185, a sub-controller 412 specifically configured to interface with the probe module 300, and a sub-controller 415 specifically configured to interface with the target delivery system 145. Moreover, the control system 470 can include other sub-controllers specifically configured to interface with other components of the light source 100 not shown in FIG. 1.

The control system 470 generally includes one or more of digital electronic circuitry, computer hardware, firmware, and software. The control system 470 can also include memory 450, which can be read-only memory and/or random access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks. The control system 470 can also include one or more input devices 455 (such as a keyboard, touch screen, microphone, mouse, hand-held input device, etc.) and one or more output devices 460 (such as speakers and monitors).

The control system 470 includes one or more programmable processors 465, and one or more computer program products 467 tangibly embodied in a machine-readable storage device for execution by a programmable processor (such as the processors 465). The one or more programmable processors 465 can each execute a program of instructions to perform desired functions by operating on input data and generating appropriate output. Generally, the processor 465 receives instructions and data from memory 450. Any of the foregoing may be supplemented by, or incorporated in, specially designed ASICs (application-specific integrated circuits).

Moreover, any one or more of the sub-controllers 400, 405, 410, 412, 415 can include their own digital electronic circuitry, computer hardware, firmware, and software as well as dedicated memory, input and output devices, programmable processors, and computer program products. Likewise, any one or more of the sub-controllers 400, 405, 410, 412, 415 can access and use the memory 450, the input devices 455, the output devices 460, the programmable processors 465, and the computer program products 467.

Although the control system 470 is shown as a separate and complete unit, it is possible for each of the components and sub-controllers 400, 405, 410, 412, 415 to be separate units within the light source 100.

Referring to FIG. 5, an exemplary diagnostic system 505 is shown as having a probe module such as an illumination module 500 that includes a single light source 502 that produces, under control of the control system 170, 470, 670, a light beam 510, a set of optical components 515, 517, and a pair of diagnostic light beams 520, 530 that serve as the diagnostic probe 107. The optical components 515, 517 of the set are configured and designed to split the light beam 510 into the two diagnostic light beams 520, 530 as well as direct the diagnostic light beams 520, 530 toward the trajectory TR of the current target 110. In some examples, the optical component is a beam splitter 515 that splits the light beam 510 into diagnostic light beams 520, 530. For example, the beam splitter 515 can be a dielectric mirror, a beam splitter cube, or a polarizing beam splitter. One or more optical components 517 such as reflective optics can be placed to redirect either or both of the diagnostic light beams 520, 530 so that both diagnostic light beams 520, 530 are directed toward the trajectory TR of the current target 110. The set of optical components 515, 517 can include other optical components not shown or in a different configuration from what is shown.

The diagnostic system 505 includes the detection module 535, which is configured to detect the light 540, 550 reflected from the current target 110 as the respective diagnostic light beam 520, 530 strikes the target 110. The detection module 535 can include a device such as a photodiode that converts the light (in the form of photons) into a current, and outputs a voltage that is related to the current. Thus, in this example, the output from the detection module 535 constitutes a one-dimensional voltage signal, which is output to the control system 670. The detection module 535 can also include optical filters, amplifiers, and built-in lenses, as needed. The photodiode generates the current when photons from the light 540, 550 are absorbed in the photodiode and outputs a voltage signal that corresponds to the generated current. The detection module 535 generates as the voltage signal an analog pulse 560 when the light 540 is detected and an analog pulse 570 when the light 550 is detected. These pulses 560, 570 are output from the detection module 535 to the control system 670 for further processing.

As shown, the detection module 535 includes a single device such as a photodiode detector that is able to detect both of the interactions (that is, both the light 540, 550). Such a design that uses a single device reduces complexity and also enables the data to be more efficiently analyzed. In other implementations, the detection module 535 includes one or more photo-transistors, light-dependent resistors, and photomultiplier tubes. In other implementations, the detection module 535 includes one or more thermal detectors such as a pyroelectric detector, a bolometer, or a calibrated charged coupled device (CCD) or CMOS.

Figure 6:
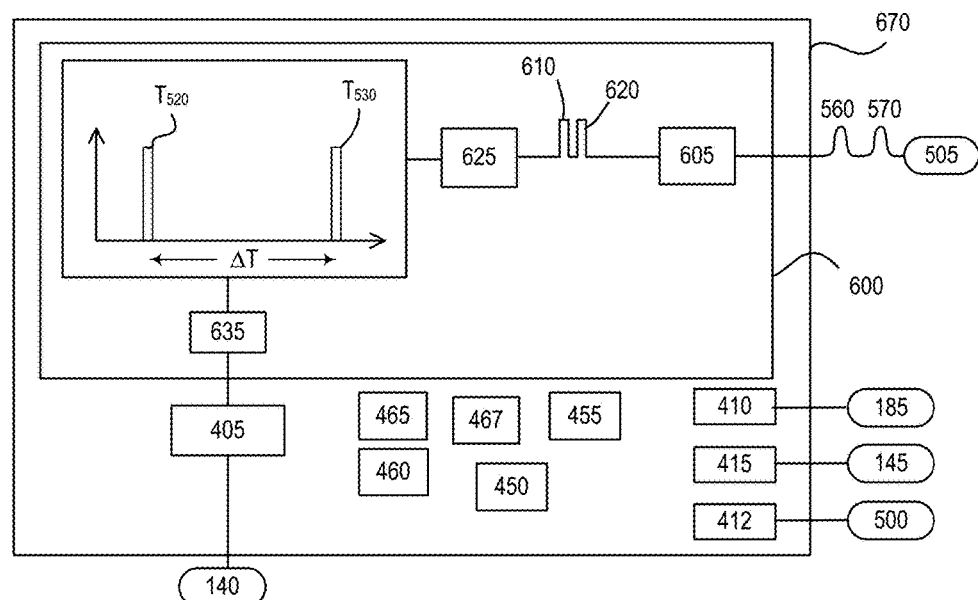
FIG. 6 is a block diagram of an exemplary control system of the EUV light source of FIG. 1.

Referring to FIG. 6, an exemplary control system 670 is shown for processing the output from the diagnostic system 505 to determine a value of the velocity (moving property) of the current target 110 along the X direction. The exemplary control system 670 includes a detection sub-controller 600 that receives the pulses 560, 570 from the diagnostic system 505. The detection sub-controller 600 includes a discriminator module 605 that receives the pulses 560, 570 and filters this signal, amplifies this signal, and differentiates it, as needed. At a zero-crossing of the derivative of each current target 110 signal (generated from the pulses 560, 570), the discriminator module 605 generates a digital trigger pulse 610, 620, respectively. The discriminator module 605 can be an electrical circuit that includes a filter and a gain circuit as well as a peak predict circuit with differentiation capabilities.

The detection sub-controller 600 also includes a time module 625 that receives the digital trigger pulses 610, 620 and digitally time stamps each individual trigger pulse 610, 620 as $T_{520}$ and $T_{530}$. The difference between the time stamps $T_{520}$ and $T_{530}$ is given as $\Delta T$. The detection sub-controller 600 includes a moving property module 635 to which the value of $\Delta T$ is input. Thus, the detection sub-controller 600 converts the signals associated with the respective light 540, 550 reflected from the current target 110 into respective single data values such as time stamps that can be used for further analysis.

The moving property module 635 also accesses the value of $\Delta d$ from memory 450, which can be internal to or external to the moving property module 635. The moving property module 635 determines the value of the velocity of the current target 110 in the extended target region 115. For example, the moving property module 635 could use the determined value of $\Delta T$ and the value of $\Delta d$, and compare those values to a set of pre-determined values stored in memory such as memory 450 to determine a value of the velocity of the current target 110. As another example, the moving property module 635 could calculate the average velocity V of the current target 110 along the X direction as $\Delta d/\Delta T$.

The moving property module 635 can also estimate or determine an acceleration of the current target 110 if assumptions are made about the motion of the current target 110. It is possible to determine trends in the velocity V or the changing velocity V over many targets.

The moving property module 635 also determines the predicted time that the present target 110' (which can be the current target 110) will be at the target location 122 within the target space 120. The moving property module 635 is able to determine the predicted time of arrival of the current target 110 at the target location 122 because the value of the velocity V of the current target 110 has been determined as well as other information about the current target 110 and the diagnostic radiation beam 530 relative to the target location 122. Specifically, the moving property module 635 knows the distance $D_{RB2}$ between the crossing of the diagnostic light beam 530 with the trajectory TR of the current target 110 and the target location 122 along the X direction. The moving property module 635 also knows the time that the current target 110 passed through the path of the diagnostic light beam 530. Thus, it is possible to estimate or determine the arrival of the current target 110 at the target location 122 as being the distance $D_{RB2}$ divided by the velocity V (or $D_{RB2}/V$).

The output from the moving property module 635 is a control signal and is directed to the optical source sub-controller 405, which interfaces with the adjustment system 190 coupled to the optical source 140. The control signal from the moving property module 635 provides instructions that cause the adjustment system 190 to adjust aspects of the optical source 140 to thereby adjust one or more of a timing of a release of the radiation pulse 135 and a direction at which the radiation pulse 135 travels.

Referring to FIG. 7, in other implementations, an exemplary diagnostic system 705 includes an illumination module 700 that produces as the diagnostic probe 107 three diagnostic light beams 720, 725, 730. The diagnostic light beams 720, 725, 730 are directed toward respective locations 722, 724, 728 along the trajectory TR of the current target 110 to interact with the current target 110 at respective times $T_{722}$, $T_{724}$, $T_{728}$. The respective interactions between the diagnostic light beams 720, 725, 730 and the current target 110 produce light 740, 745, 750. The diagnostic system 705 therefore includes the detection module 735, which is configured to detect the light 740, 745, 750 reflected from the current target 110 as the respective diagnostic light beam 720, 725, 730 interacts with the current target 110. The detection module 735 can include a device such as a photodiode that converts the light into current. The diagnostic system 705 can be coupled to a control system 870, which is a specific implementation of the control system 170 and will be discussed with reference to FIG. 8.

By including a third diagnostic light beam 725, it is possible to determine not only a moving property such as velocity V of the current target 110 along the −X direction, but also to determine a change in the moving property of the current target 110 along the −X direction. Thus, the use of the third diagnostic light beam 725 enables the control system 170 to determine both the velocity V and the acceleration A of the current target 110 along the −X direction.

Additionally, because the third diagnostic light beam 725 is directed toward the trajectory TR at a non-right angle relative to the trajectory TR, the control system 870 is able to determine one or more moving properties (such as the velocity or trajectory) of the current target 110 along a direction that is perpendicular to the −X direction, for example along the Y direction, as discussed below.

The diagnostic light beams 720, 730 are directed along a path that crosses the trajectory TR of the current target 110 at a right (90°) or approximately right angle relative to the −X direction. The diagnostic light beam 725 is directed along a path that crosses the trajectory TR of the current target 110 at a non-right angle (for example, at an angle of approximately 45°) relative to the −X direction. Thus, the diagnostic light beams 720, 730 generally travel along the −Y direction while the diagnostic light beam 725 travels along a direction in a plane defined by the X and Y (generally along −Y and either −X or X directions).

As discussed above, the diagnostic light beams 720, 725, 730 interact with the current target 110 as the current target 110 travels toward the target space 120 and while in the extended target region 115. The diagnostic light beams 720, 725, 730 are separated from each other along the X direction by known distances, as discussed below, and this known information can be used to determine one or more moving properties of the current target 110. For example, the velocity and acceleration of the current target 110 along the −X direction can be determined. Additionally, information about a displacement or motion along the Y direction can also be determined.

Figure 8:
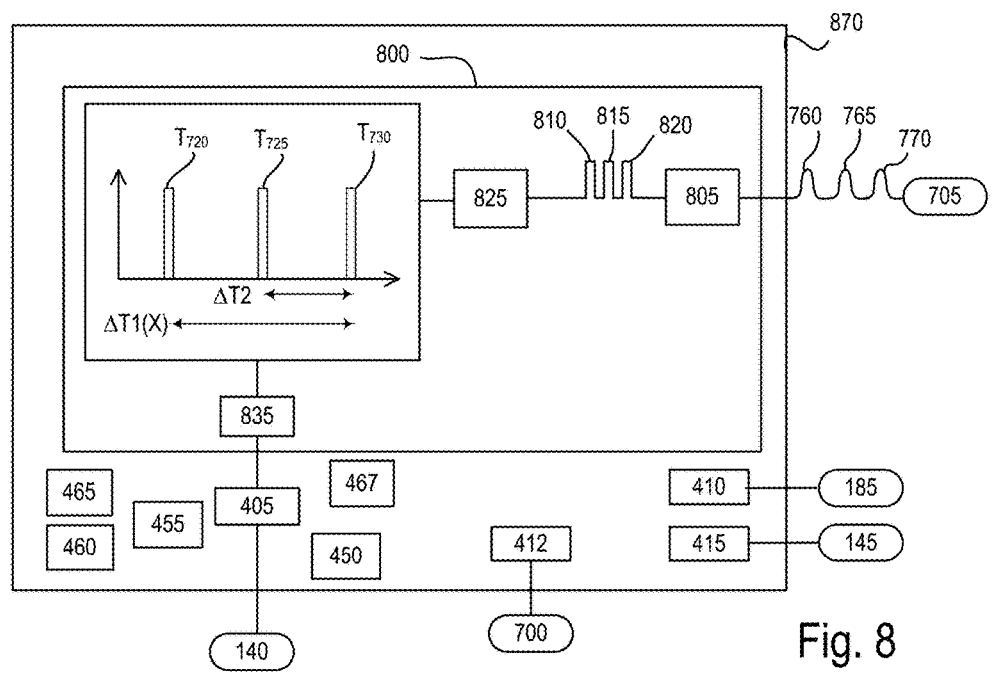
FIG. 8 is a block diagram of an exemplary control system of the EUV light source of FIG. 1.

Referring to FIG. 8, an exemplary detection sub-controller 800 can be designed as a part of the control system 870 in order to analyze the data obtained from the interaction between the diagnostic system 705 and the current target 110. For example, the detection sub-controller 800 receives pulses 760, 765, 770 output from the diagnostic system 705. The pulses 760, 765, 770 correspond to the analog pulses produced by the detection module 735 when respective light 740, 745, 750 is detected.

The distance between the diagnostic light beams 720, 730 along the X direction is known and can be denoted as $\Delta d1(X)$. In one example, the separation $\Delta d1(X)$ is 100 µm. Thus, the diagnostic light beams 720, 730 can be used by the control system 870 to determine the velocity V1 of the current target 110 along the −X direction in the extended target region 115 using, for example, the method discussed above with respect to FIGS. 5 and 6. Specifically, control system 170 determines time stamps $T_{722}$ and $T_{728}$ associated with the light 740, 750 produced from the interaction between the respective diagnostic light beams 720, 730 and the current target 110 at respective locations 722, 728 along the trajectory TR. The control system 870 calculates the difference between these time stamps $\Delta T1(X)$. The control system 870 determines the value of the velocity V1 of the current target 110 along the −X direction in the extended target region 115 based on the determined values of $\Delta T1(X)$ and $\Delta d1(X)$. For example, the control system 870 can calculate the velocity V1 of the current target 110 along the X direction as $\Delta d1(X)/\Delta T1(X)$.

Additionally, the control system 870 determines a time stamp $T_{724}$ associated with the light 745 produced from the interaction between the diagnostic light beam 725 and the current target at the location 724 along the trajectory TR. The distance along the −X direction between the diagnostic light beams 720 and 725 at the locations 722, 724 is known and can be denoted as $\Delta d2(X)$. The distance along the −X direction between the diagnostic light beams 725 and 730 at the locations 724, 728 is also known and can be denoted as $\Delta d3(X)$. Using this additional information, the control system 870 can calculate a time difference $\Delta T2(X)$ between the time stamps $T_{724}$ and $T_{722}$ and a time difference $\Delta T3(X)$ between the time stamps $T_{728}$ and $T_{724}$. The control system 870 can therefore determine the velocity V2 of the current target along the −X direction as it travels between location 722 and 724 as $\Delta d2(X)/\Delta T2(X)$, and the velocity V3 of the current target along the −X direction as it travels between location 724 and 728 as $\Delta d3(X)/\Delta T3(X)$.

The diagnostic light beam 725 can be used in combination with one or more of the diagnostic light beams 720, 730 to determine a change in a moving property (for example, an acceleration A) of the current target 110 along the −X direction. Specifically, the control system 870 determines the time stamp $T_{724}$ associated with the light 745 produced from the interaction of the diagnostic light beam 725 and the current target 110 at the location 724. In this way, the velocity V2(X) can be determined for the current target 110 between the diagnostic light beam 720 and the diagnostic light beam 725 based on a difference $\Delta T2(X)$ between the time stamps $T_{722}$ and $T_{724}$ and a distance $\Delta d2(X)$ between the locations 722 and 724. Moreover, the velocity V3(X) can be determined for the current target 110 between the diagnostic light beam 725 and the diagnostic light beam 730 based on a difference $\Delta T3(X)$ between the time stamps $T_{724}$ and $T_{728}$ and a distance $\Delta d3(X)$ between the locations 724 and 728. The difference between these two velocities (V2 (X)−V3(X)) can be divided by the time difference to obtain the acceleration of the current target 110 along the −X direction. For example, it can be assumed that the current target 110 has the velocity V2(X) at time $T_{724}$ and the velocity V3(X) at time $T_{728}$ and thus the acceleration A can be determined to be $(V2(X)-V3(X))/(T_{724}-T_{728})$.

As discussed above, the diagnostic light beams 720, 725, 730 produced by the laser source within the illumination module 700 can be Gaussian beams. In this case, the transverse profile of the optical intensity of each diagnostic light beam 720, 725, 730 can be described with a Gaussian function. In such a function, the optical intensity correlates with the transverse distance from the axis of the light beam 720, 725, or 730. Because the Gaussian shape is relatively simple, this particular aspect of the diagnostic light beam 725 can be used to process data obtained from the interaction between the diagnostic light beams 720, 725, 730 and the current target 110.

The diagnostic light beam 725 can be used by the control system 870 to determine a trajectory of the current target 110, specifically, to determine a distance or a velocity that the current target 110 travels along the Y direction. This can be determined because the diagnostic light beam 725 is directed at an angle in a plane defined by the X and Y directions.

Figure 9A:
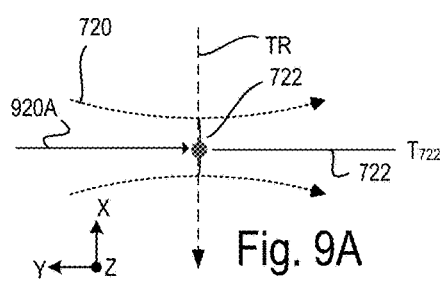
FIG. 9A is a schematic diagram showing a close up of the interaction between a diagnostic radiation beam and a current target in which the diagnostic radiation beam axis is generally perpendicular to a trajectory of the current target and the current target trajectory is aligned with an X direction.

As shown in FIG. 9A, the diagnostic light beam 720 crosses the trajectory TR at the location 722. The diagnostic light beam 720 travels along a direction defined by its axis 920A, which generally aligns with the −Y direction. In FIG. 9A, the current target 110 generally aligns with the X direction (is at Y=0) and thus the current target 110 does not have a measurable Y direction component to it. By contrast, in FIG. 9B, the current target 110 is offset from the X direction along the −Y direction by an amount dY. However, because this offset still aligns with the axis 920A of the diagnostic light beam 720, the reflected light 740 from the current target will not change by a significant amount. Moreover, the time at which the reflected light 740 is detected in both examples (FIGS. 9A and 9B) is the same or nearly the same because the interaction between the target 110 and the diagnostic light beam 720 occurs at approximately the same time. It is noted that the intensity of the diagnostic light beam 720 does change by an amount depending on the distance from the beam waist, but that change may not significant enough to be measurable or to show up as a change in the intensity of the reflected light 740.

Figure 9C:
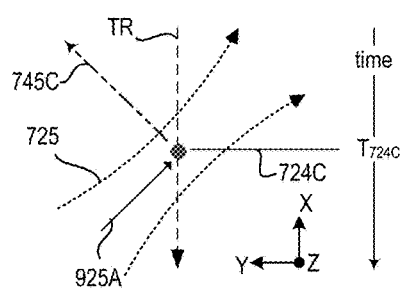
FIG. 9C is a schematic diagram showing a close up of the interaction between a diagnostic radiation beam and a current target in which the diagnostic radiation beam is directed at an angle along an axis that is in the XY plane and the current target trajectory is aligned with the X direction.
Figure 9B:
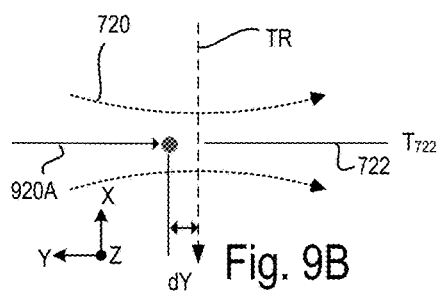
FIG. 9B is a schematic diagram showing a close up of the interaction between a diagnostic radiation beam and a current target in which the diagnostic radiation beam axis is generally perpendicular to a trajectory of the current target and the current target trajectory is offset from an X direction along a Y direction.
Figure 9D:
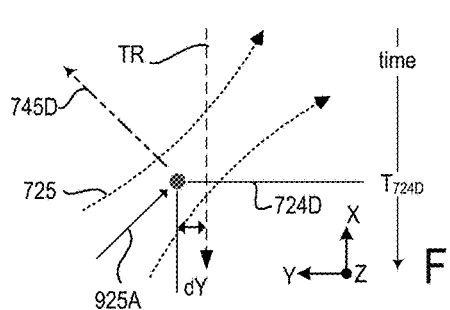
FIG. 9D is a schematic diagram showing a close up of the interaction between a diagnostic radiation beam and a current target in which the diagnostic radiation beam is directed along an axis that is in the XY plane and the current target trajectory is offset from the X direction along the Y direction.

By contrast, as shown in FIG. 9C, the diagnostic light beam 725 crosses the trajectory TR at the location 724C and the current target 110 interacts with the diagnostic light beam 725 at the time $T_{724C}$. In this case, the diagnostic light beam 725 travels along a direction that is in the XY plane and its axis 925A has components in both the X and Y directions. Thus, the intensity of the beam 725 decreases according to the Gaussian function along both the X and Y directions. The current target 110 aligns with the −X direction and does not have any appreciable motion along the Y direction. By contrast, as shown in FIG. 9D, the current target 110 is shifted along the Y direction by the distance dY. In FIG. 9D, the diagnostic light beam 725 is directed such that its axis 925A has components in both the X and Y directions, and the offset current target 110 would be interacting with the highest intensity of the light beam 725 at a different location 724D and also at a time $T_{724D}$, which is later than the time $T_{724C}$. Therefore, the detection module 735 detects the reflected light 745D in FIG. 9D at a later time than it would detect the reflected light 745C in FIG. 9C. This difference in time at which the reflected light 745C or 745D is detected by the detection module 735 can be used to determine how far the current target 110 has shifted along the Y direction.

Specifically, if the time difference ΔT2(X) for a current target 110 is greater than the time difference ΔT2(X) for a prior target 110P then this means that the current target 110 has moved along the Y direction relative to the prior target 110P. By contrast if the time difference ΔT2(X) for a current target 110 is less than the time difference ΔT2(X) for a prior target 110P then this means that the current target 110 has moved along the −Y direction relative to the prior target 110P.

Figure 10:
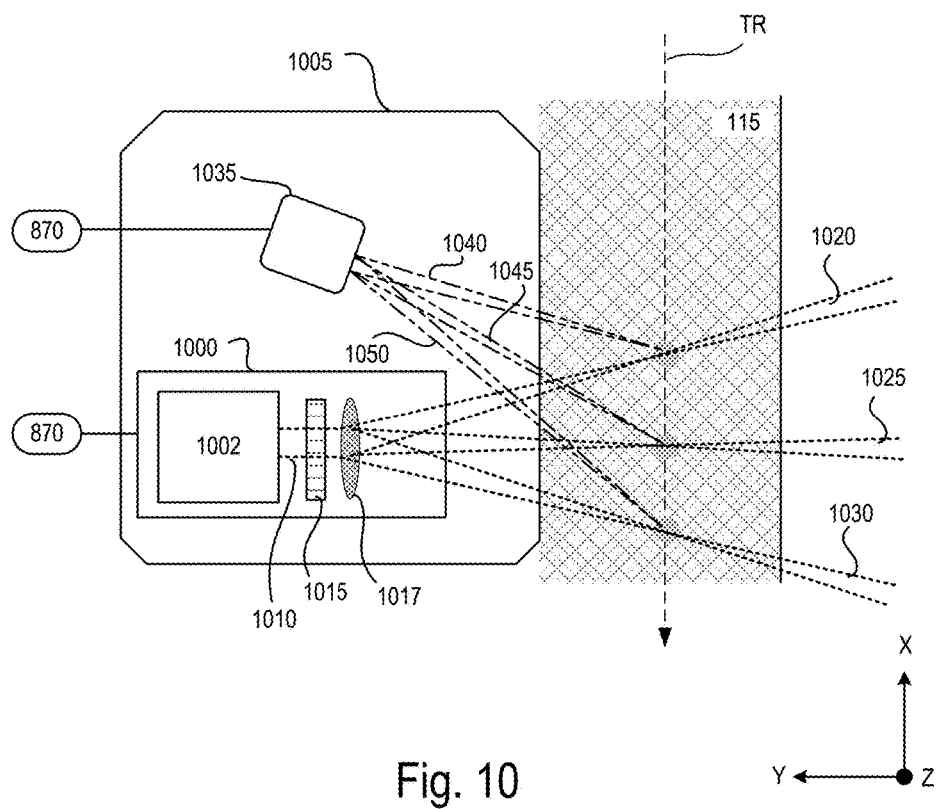
FIG. 10 is a block diagram of an exemplary diagnostic system of the EUV light source of FIG. 1.

Referring to FIG. 10, in other implementations, an exemplary diagnostic system 1005 includes an illumination module 1000 that includes a single light source 1002 that produces a light beam 1010. The diagnostic system 1005 produces a plurality of diagnostic light beams 1020, 1025, 1030 that serve as the diagnostic probe or probes 107. To this end, the illumination module 1000 also includes a diffractive optic 1015 and a refractive optic 1017 such as a focusing lens. The light beam 1010 is directed through the diffractive optic 1015, which splits the light beam 1010 into a plurality of light beams, which travel along distinct directions and are directed through the refractive optic 1017 to produce the diagnostic light beams 1020, 1025, 1030. The diagnostic light beams 1020, 1025, 1030 are directed toward the trajectory TR of the current target 110. The diffractive optic 1015 can split the light beam 1010 so that the diagnostic light beams 1020, 1025, 1030 are separated by a set distance (for example, 0.65 mm) at the trajectory TR. Moreover, the refractive optic 1017 can ensure that the foci (or beam waist) of each of the diagnostic light beams 1020, 1025, 1030 overlaps the trajectory TR.

Because of the design of the diffractive optic 1015 and the refractive optic 1017, the diagnostic light beams 1020, 1025, 1030 are directed so that they fan out toward the trajectory TR and intersect the trajectory TR at different and distinct angles. For example, the diagnostic light beam 1025 can intersect the trajectory TR at a right or approximately right angle to the −X direction. The diagnostic light beam 1020 can intersect the trajectory TR at an angle that is less than 90° relative to the −X direction and the diagnostic light beam 1030 can intersect the trajectory TR at an angle that is greater than 90° relative to the −X direction. Each of the diagnostic light beams 1020, 1025, 1030 can be Gaussian beams so that the transverse profile of the optical intensity of each diagnostic light beam 1020, 1025, 1030 can be described with a Gaussian function. The beam waist of each diagnostic light beam 1020, 1025, 1030 can be configured to overlap at the trajectory TR or the −X direction.

The diffractive optic 1015 can be a rectangular or binary phase diffraction grating that produces discrete and spatially spaced replicas of the input light beam 1010. The separation between the diagnostic light beams 1020, 1025, 1030 can be adjusted or customized depending on the rate at which the targets are released from the target delivery system 145 as well as the size and material of the targets. It is also possible to produce more than three diagnostic light beams 1020, 1025, 1030 with the diffractive optic 1015. By producing so many diagnostic light beams, it is possible to record or detect the position of the current target 110 through the extended target region 115, thus allowing for a more accurate determination of the velocity and acceleration of the current target 110 and also providing a tool for understanding the dynamics of the current target 110 as a result of the plasma pushback forces 125.

In some implementations, the diffractive optic 1015 is a binary phase diffraction grating.

The diagnostic system 1005 also includes a detection module 1035 that receives the light 1040, 1045, 1050 reflected from the current target 110 as it passes across the respective diagnostic light beams 1020, 1025, 1030. The detection module 1035 can include a detection device that converts the photons of the light 1040, 1045, 1050 into a current, and outputs a one-dimensional voltage signal based on the current. For example, the detection module 1035 can include a photon detection device such as a photodiode that converts the light 1040, 1045, 1050 into an electrical signal.

Figure 11:
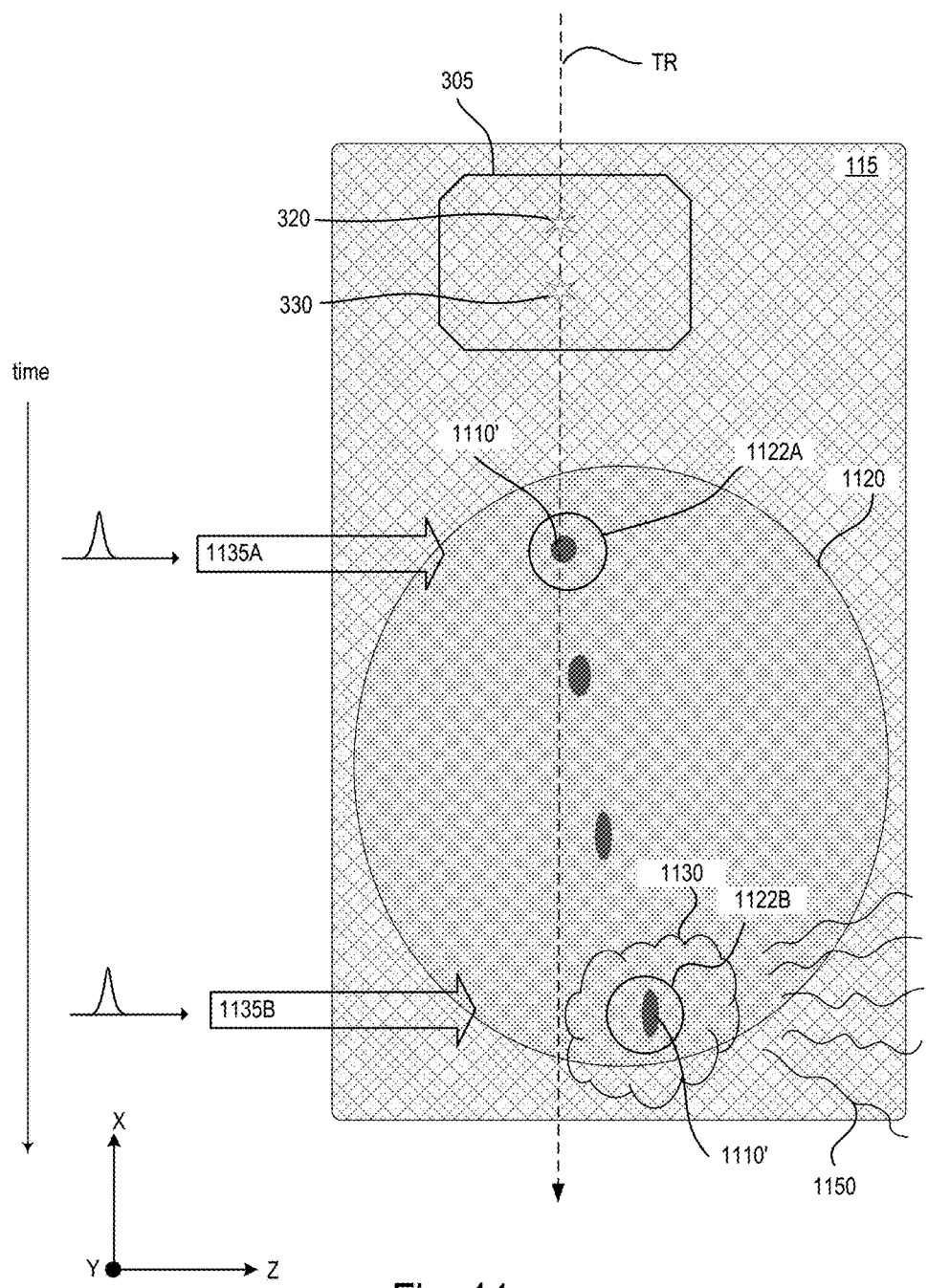
FIG. 11 is a schematic diagram showing a preliminary radiation pulse directed to a first target location and a main radiation pulse directed to a second target location for interaction with the current target of the EUV light source of FIG. 1.

Referring to FIG. 11, in some implementations, the present target 110' interacts with two radiation pulses within the target space 120. For example, the optical source 140 can be configured to supply a preliminary radiation pulse 1135A to a first target location 1122A within a target space 1120 and a main radiation pulse 1135B to a second target location 1122B within the target space 1120. The radiation pulses 1135A, 1135B can be directed along the Z direction.

The interaction between the preliminary radiation pulse 1135A and the present target 1110' at the first target location 1122A causes the present target 1110' to modify its shape so as to deform and to geometrically expand as it moves through the target space 1120. The interaction between the main radiation pulse 1135B and the modified present target 1110' at the second target location 1122B converts at least part of the modified present target 1110' into plasma 1130 that emits EUV light 1150. It is possible for some of the material of the present target 1110' to be converted into plasma when it interacts with the preliminary radiation pulse 1135A. However, the properties of the preliminary radiation pulse 1135A are selected and controlled so that the predominant action on the present target 1110' by the preliminary radiation pulse 1135A is the deformation and modification of the geometric distribution of the present target 1110'.

The interaction between the preliminary radiation pulse 1135A and the present target 1110' causes material to ablate from the surface of the present target 1110' and this ablation provides a force that deforms the present target 1110' so that it has a shape that is different than the shape of the present target 1110' prior to interaction with the preliminary radiation pulse 1135A. For example, prior to interacting with the preliminary radiation pulse 1135A, the present target 1110' can have a shape that is similar to a droplet upon exiting the target delivery system 145, while after interaction with the preliminary radiation pulse 1135A, the shape of the present target 1110' deforms so that its shape is closer to the shape of a disk (such as a pancake shape) when it reaches the second target location 1122B. After interaction with the preliminary radiation pulse 1135A, the present target 1110' can be a material that is not ionized (a material that is not a plasma) or that is minimally ionized. After interaction with the preliminary radiation pulse 1135A, the present target 1110' can be, for example, a disk of liquid or molten metal, a continuous segment of target material that does not have voids or substantial gaps, a mist of micro- or nano-particles, or a cloud of atomic vapor.

Additionally, the interaction between the preliminary radiation pulse 1135A and the present target 1110' that causes the material to ablate from the surface of the present target 1110' can provide a force that can cause the present target 1110' to acquire some propulsion or speed along the Z direction, as shown in FIG. 11. The expansion of the present target 1110' as it travels from the first target location 1122A to the second target location 1122B in the X direction and the acquired speed in the Z direction depend on an energy of the preliminary radiation pulse 1135A, and in particular, on the energy delivered to (that is, intercepted by) the present target 1110'.

The optical source 140 can be designed to produce a beam of preliminary radiation pulses 1135A and a beam of main radiation pulses 1135B directed to respective target locations 1122A, 1122B. Moreover, as discussed above, the EUV light source 100 adjusts one or more characteristics of the radiation pulse 135 that is directed to the target space 120 based on the analysis of the determined moving property or properties of the current target 110. Accordingly, it is possible for the EUV light source 100 to adjust one or more characteristics of the preliminary radiation pulse 1135A, one or more characteristics of the main radiation pulse 1135B, or one or more characteristics of both of the preliminary radiation pulse 1135A and the main radiation pulse 1135B.

Figure 12:
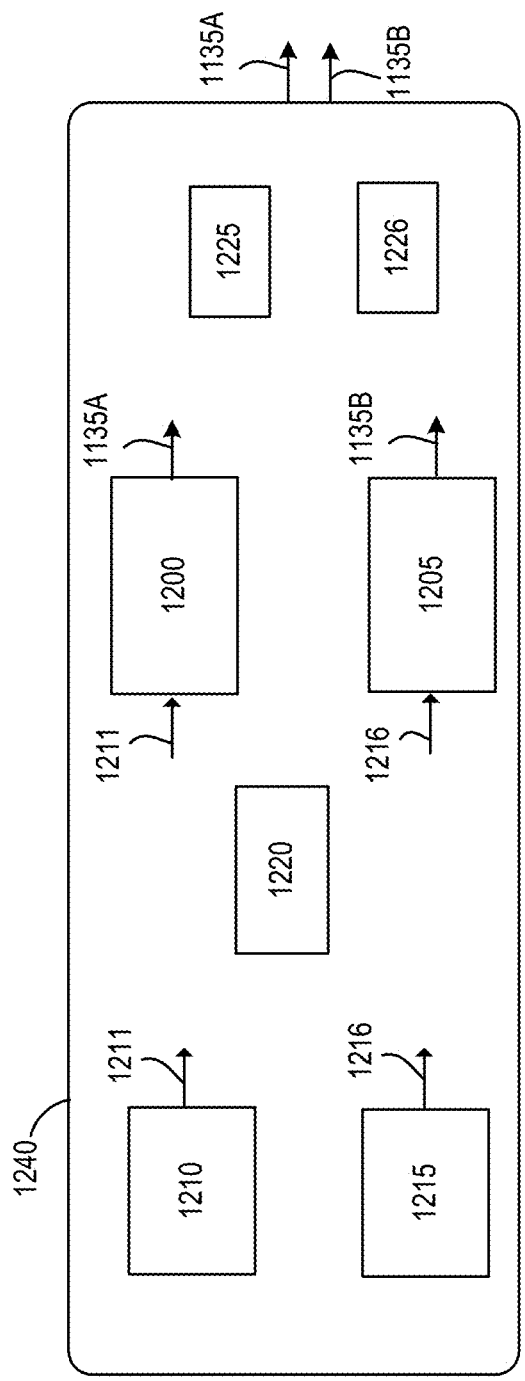
FIG. 12 is a block diagram of an exemplary optical source for use in the EUV light source of FIG. 1.

Referring to FIG. 12, an exemplary optical source 1240 is designed to produce the beam of preliminary radiation pulses 1135A and the beam of main radiation pulses 1135B directed toward their respective target locations 1122A, 1122B within the target space 1120.

The optical source 1240 includes a first optical amplifier system 1200 that includes a series of one or more optical amplifiers through which the beam of preliminary radiation pulses 1135A is passed, and a second optical amplifier system 1205 that includes a series of one or more optical amplifiers through which the beam of main radiation pulses 1135B is passed. One or more amplifiers from the first system 1200 can be in the second system 1205; or one or more amplifiers in the second system 1205 can be in the first system 1200. Alternatively, it is possible that the first optical amplifier system 1200 is entirely separate from the second optical amplifier system 1205.

Additionally, though not required, the optical source 1240 can include a first light generator 1210 that produces a first pulsed light beam 1211 and a second light generator 1215 that produces a second pulsed light beam 1216. The light generators 1210, 1215 can each be, for example, a laser, a seed laser such as a master oscillator, or a lamp. An exemplary light generator that can be used as the light generator 1210, 1215 is a Q-switched, radio frequency (RF) pumped, axial flow, carbon dioxide ($CO_2$) oscillator that can operate at a repetition rate of, for example, 100 kHz.

The optical amplifiers within the optical amplifier systems 1200, 1205 each contain a gain medium on a respective beam path, along which a light beam 1211, 1216 from the respective light generator 1210, 1215 propagates. When the gain medium of the optical amplifier is excited, the gain medium provides photons to the light beam, amplifying the light beam 1211, 1216 to produce the amplified light beam that forms the preliminary radiation pulse beam 1135A or the main radiation pulse beam 1135B.

The wavelengths of the light beams 1211, 1216 or the radiation pulse beams 1135A, 1135B can be distinct from each other so that the radiation pulse beams 1135A, 1135B can be separated from each other, if they are combined at any point within the optical source 1240. If the radiation pulse beams 1135A, 1135B are produced by $CO_2$ amplifiers, then the preliminary radiation pulse beam 1135A can have a wavelength of 10.26 micrometers ($\mu m$) or 10.207 $\mu m$, and the main radiation pulse beam 1135B can have a wavelength of 10.59 $\mu m$. The wavelengths are chosen to more easily enable separation of the beams 1135A, 1135B using dispersive optics or dichroic mirror or beamsplitter coatings. In the situation in which both beams 1135A, 1135B propagate together in the same amplifier chain (for example, a situation in which some of the amplifiers of optical amplifier system 1200 are in the optical amplifier system 1205), then the distinct wavelengths can be used to adjust a relative gain between the two beams 1135A, 1135B even though they are traversing through the same amplifiers.

For example, the beams 1135A, 1135B, once separated, could be steered or focused to two separate locations (such as the first and second target locations 1122A, 1122B, respectively) within the chamber 175. In particular, the separation of the beams 1135A, 1135B also enables the target 1110 to expand after interacting with the beam of preliminary radiation pulses 1135A while it travels from the first target location 1122A to the second target location 1122B.

The optical source 1240 can include a beam path combiner 1225 that overlays the beam of preliminary radiation pulses 1135A and the beam of main radiation pulses 1135B and places the beams 1135A, 1135B on the same optical path for at least some of the distance between the optical source 1240 and the beam delivery system 185. Additionally, the optical source 1240 can include a beam path separator 1226 that separates the beam of preliminary radiation pulses 1135A from the beam of main radiation pulses 1135B so that the two beams 1135A, 1135B can be separately steered and focused within the chamber 175.

Additionally, the beam of preliminary radiation pulses 1135A can be configured to have less pulse energy than the pulse energy of the beam of main radiation pulses 1135B. This is because the preliminary radiation pulse 1135A is used to modify the geometry of the present target 1110' while the main radiation pulse 1135B is used to convert the modified present target 1110' into plasma 1130. For example, the energy of the preliminary radiation pulse 1135A can be 5-100 times less than the energy of the main radiation pulse 1135B.

In some implementations, each optical amplifier system 1200, 1205 includes a set of three optical amplifiers, though as few as one amplifier or more than three amplifiers can be used. In some implementations, each of the optical amplifiers in each system 1200, 1205 includes a gain medium that includes $CO_2$ and can amplify light at a wavelength of between about 9.1 µm and about 11.0 µm, and in particular, at about 10.6 µm, at a gain greater than 1000. It is possible for the optical amplifiers in each system 1200, 1205 to be operated similarly or at different wavelengths. Suitable amplifiers and lasers for use in the optical amplifier systems 1200, 1205 can include a pulsed laser device such as a pulsed gas-discharge $CO_2$ amplifier producing radiation at about 9.3 µm or about 10.6 µm, for example, with DC or RF excitation, operating at relatively high power, for example, 10 kW or higher and high pulse repetition rate, for example, 50 kHz or more. Exemplary optical amplifiers that can be used in each of the systems 1200, 1205 are axial flow high-power $CO_2$ lasers with wear-free gas circulation and capacitive RF excitation.

Additionally, though not required, one or more of the optical amplifier systems 1200 and 1205 can include a first amplifier that acts as a pre-amplifier. The pre-amplifier, if present, can be a diffusion-cooled $CO_2$ laser system.

The optical amplifier systems 1200, 1205 can include optical elements that are not shown in FIG. 12 for directing and shaping the respective light beams 1211, 1216. For example, the optical amplifier systems 1200, 1205 can include reflective optics such as mirrors, partially-transmissive optics such as beam splitters or partially-transmissive mirrors, and dichroic beam splitters.

The optical source 1240 also includes an optical system 1220 that can include one or more optics (such as reflective optics such as mirrors, partially reflective and partially transmissive optics such as beamsplitters, refractive optics such as prisms or lenses, passive optics, active optics, etc.) for directing the light beams 1211, 1216 through the optical source 1240.

Although the optical amplifiers can be separate and dedicated systems, it is possible for at least one of the amplifiers of the optical amplifier system 1200 to be in the optical amplifier system 1205 and for at least one of the amplifiers of the optical amplifier system 1205 to be in the optical amplifier system 1200. In such a system in which at least some of the amplifiers and optics overlap between the optical amplifier systems 1200, 1205, it is possible that the beam of preliminary radiation pulses 1135A and the beam of main radiation pulses 1135B are coupled together such that changes of one or more characteristics of the beam 1135A can cause changes to one or more characteristics of the beam 1135B, and vice versa.

Figure 13:
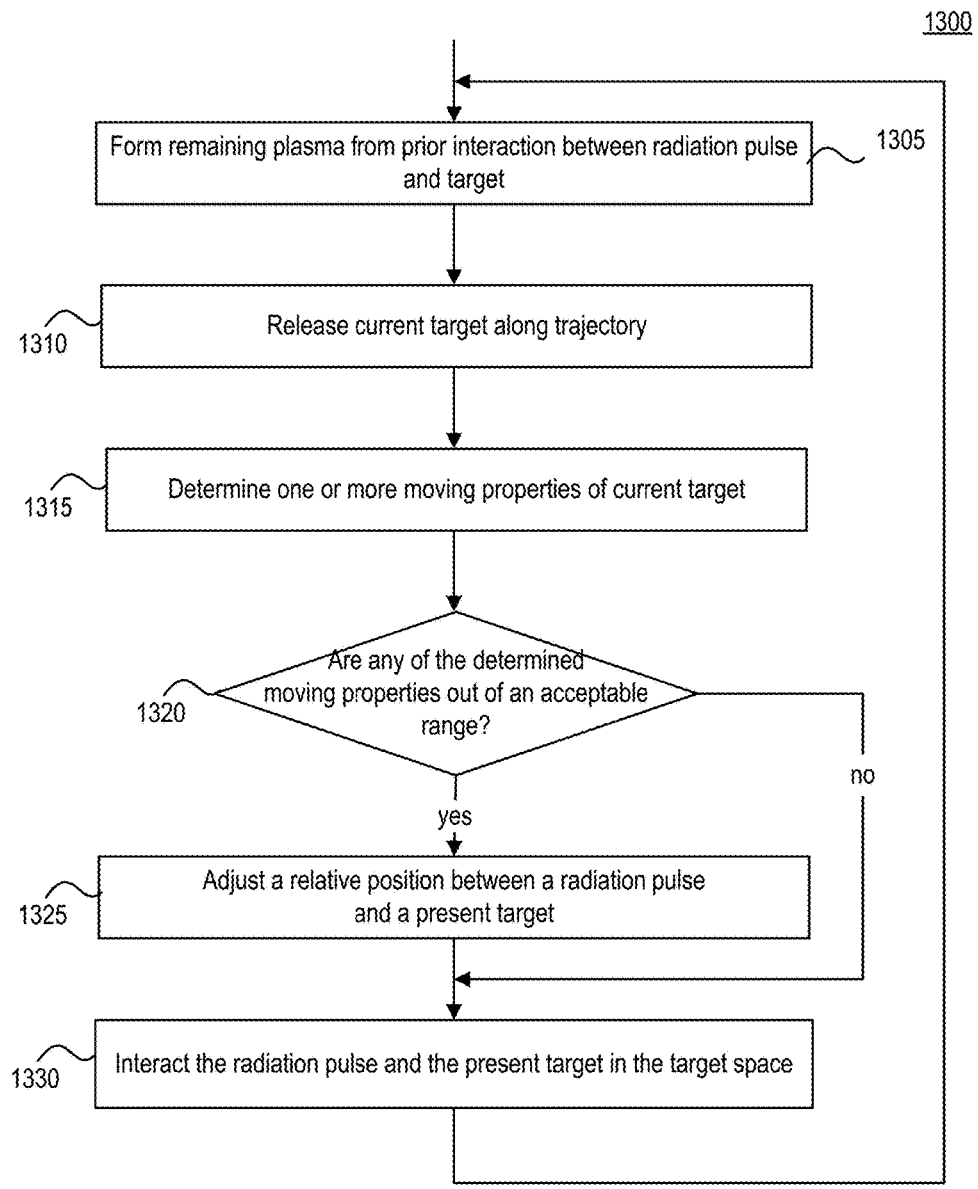
FIG. 13 is a flow chart of an exemplary procedure performed by the EUV light source (under control of the control system) for determining a moving property of a current target in the extended target region.

Referring to FIG. 13, a procedure 1300 is performed by the EUV light source 100 (under control of the control system 170, 470, 670 or 870) for compensating for plasma pushback forces 125 on a present target 110'. Other procedures not discussed herein can be performed by the EUV light source 100 during operation. The procedure 1300 includes forming the remaining plasma 130 that at least partially coincides with the extended target region 115, the remaining plasma being a plasma formed from an interaction between a prior target 110P and a prior radiation pulse 135P in a target space 120 (1305). As shown in FIGS. 14A and 14B, the prior target 110P is approaching the target location 122 as the prior radiation pulse 135P is approaching the target location 122. After the prior radiation pulse 135P and the prior target 110P have interacted, the remaining plasma 130 is formed and plasma pushback forces 125 are produced, as shown in FIGS. 15A and 15B.

The current target 110 is released from the target delivery system 145 along the trajectory TR toward the target space 120 (1310). The current target 110 can be released (1310) prior to the remaining plasma 130 being formed from the interaction between the prior target 110P and the prior radiation pulse 135P (1305). For example, as shown in FIGS. 14A and 14B, the current target 110 has been released from the target delivery system 145 along the trajectory TR toward the target space 120 (1310).

One or more moving properties of the current target 110 (when the current target 110 is within the extended target region 115) are determined (1315). The moving property of the current target can be determined (1315) by detecting a first interaction between a first diagnostic light beam (such as beam 320) and the current target 110 at a first location (such as location 322) within the extended target region 115, detecting a second interaction between a second diagnostic light beam (such as beam 330) and the current target 110 at a second location (such as location 328) within the extended target region 115. The first diagnostic light beam (such as beam 320) is directed toward the current target 110 at the first location (such as location 322), and the second diagnostic light beam (such as beam 330) is directed toward the current target 110 at the second location (such as location 328).

The first interaction can be detected (for example, at the detection module 335) by detecting at least a portion of the first diagnostic light beam (such as light beam 320) that is reflected from the current target (for example, the light 340 is detected). The second interaction can be detected (for example, at the detection module 335) by detecting a portion of the second diagnostic light beam (such as light beam 33) that is reflected from the current target 110 (for example, the light 350 is detected) by the detection module 335. The moving property or properties of the current target 110 can be determined (1315) based on these detections of the reflected portions.

For example, with reference to FIGS. 16A-17B, the diagnostic system 305 is used in combination with the control system 170, 470, 670, 870 to determine the one or more moving properties of the current target 110. In FIGS. 16A and 16B, the current target 110 interacts with the diagnostic light beam 320, and the light 340 from that interaction is detected by the detection module 335. In FIGS. 17A and 17B, the current target 110 then interacts with the diagnostic light beam 330, and the light 350 from that interaction is detected by the detection module 335. The detection module 335 outputs the data to the control system 170, 470, 670, 870 for processing, as discussed above, to determine the one or more moving properties of the current target 110.

The control system 170, 470, 670, 870 determines whether any of the determined moving properties are outside of an acceptable range (1320). If any of the moving properties is out of an acceptable range (1320), then the control system 170, 470, 670, 870 adjusts one or more characteristics of the radiation pulse 135 (for example, one or more characteristics of one or more of the preliminary radiation pulse 1135A and the main radiation pulse 1135B) to thereby control a relative position between the radiation pulse 135 and the present target 110' based on the determined moving property or properties of the current target 110 (1325). The radiation pulse 135 (which may have been adjusted at 1325) is directed toward the target space 120 so that the radiation pulse 135 and the present target 110' interact in the target space 120 (1330). For example, as shown in FIGS. 18A and 18B, the present target 110' is approaching the target location 122 within the target space 120 and the adjustments have been made to the radiation pulse 135, which is also directed toward the target location. And, as shown in FIGS. 19A and 19B, the present target 110' is interacting with the current radiation pulse 135 at the target location 122.

The moving property or properties that can be determined (1315) include one or more of a speed, velocity, direction, acceleration, or location of the current target 110 along any of the directions X, Y, or Z of the three dimensional coordinate system.

In some implementations, such as shown in FIG. 11, the radiation pulse 135 can be a preliminary radiation pulse 1135A that delivers the energy to the present target 110' to modify a geometric distribution of the present target 110'. If this occurs, then the procedure 1300 can also include, after directing the current preliminary radiation pulse 1135A toward the present target 110', directing a main radiation pulse 1135B toward the present target 110' to thereby convert at least part of the present target 110' into plasma that emits EUV light 1150. FIGS. 19C and 19D show the interaction between the main radiation pulse 1135B and the present target 110' to produce the EUV light 1150.

The procedure 1300 can also include analyzing the one or more moving properties that were determined (1315). For example, the control system 170, 470, 670, 870 can determine the velocity of the current target 110 along the −X direction and predict when the present target 110' will reach the target location 122. The control system 170, 470, 670, 870 can adjust when the radiation pulse 135 is released or it can adjust the direction of the radiation pulse 135 so that the radiation pulse 135 and the present target 110' efficiently interact at the target location 122 (1325). This adjustment to the relative position between the radiation pulse 135 and the present target 110' is therefore based on the analysis of the determined moving property of the current target 110.

As also shown in FIG. 19C, the next current target 110N is released at a point in time in accordance with the rate at which the targets 110 are released from the target delivery system 145.

In some implementations, the acceleration A of the current target 110 can be determined (1315) as well as the velocity V. In such implementation, the determination (1315) would additionally include detecting a third interaction between a third diagnostic light beam and the current target at a third location within the extended target region, the third location being distinct from the first and second locations. For example, as shown in FIGS. 20A and 20B, the current target 110 is directed toward the target space 120, and, while in the extended target region 115, the current target 110 would interact sequentially with the diagnostic light beams 720, 725, 730 at respective locations 722, 724, 728. As discussed above, the resultant light 740, 745, 750 is detected by the detection module 735, which outputs data that is analyzed by the control system 170, 470, 670, 870, which can use the data to determine the acceleration A as well as the velocity V of the current target 110. Additionally, the control system 170, 470, 670, 870 can use the additional information obtained from the interaction between the current target 110 and the third diagnostic beam 725 to determine one or more moving properties of the current target 110 along a direction (such as the Y direction) perpendicular to the −X direction.

Other implementations are within the scope of the following claims.

In other implementations, the moving property of the current target 110 that is detected is a speed of the current target 110, a direction or trajectory of the current target 110, and an acceleration of the current target 110.

What is claimed is:
1. An apparatus comprising:
a chamber that defines a target space, a first region, and a second region closer to the target space than the first region;
a target delivery system configured to release a target along a trajectory toward the target space, the trajectory overlapping both the first region and the second region, the target comprising a material that emits extreme ultraviolet (EUV) light when converted to plasma and the target having a first value of a moving property in the first region and a second value of the moving property in the second region, the second value of the moving property being different from the first value of the moving property;
a diagnostic system configured to produce a diagnostic probe that interacts with the target in the second region after a prior and adjacent target has interacted with a prior radiation pulse in the target space, and to output data relating to the interaction; and
a control system that is configured to:
receive the data output from the diagnostic system;
analyze the outputted data; and
determine the second value of the moving property of the target based on an analysis of the data.

2. The apparatus of claim 1, further comprising an optical source configured to produce a plurality of radiation pulses that are directed toward the target space.

3. The apparatus of claim 2, wherein the second region is at least partially overlapping an extended target region, the extended target region is defined by a region in which remaining plasma is formed from an interaction between a prior target and a prior radiation pulse from the plurality of radiation pulses.

4. The apparatus of claim 2, wherein the control system is configured to control a relative position between a current radiation pulse and a present target based on the determined second value of the moving property of the target.

5. The apparatus of claim 4, further comprising an adjustment system coupled to the optical source and to the control system, wherein the control system is configured to control a relative position between a current radiation pulse and the present target by sending a control signal to the adjustment system, the control signal causing the adjustment system to adjust one or more of a timing of a release of the current radiation pulse and a direction at which the current radiation pulse travels.

6. The apparatus of claim 1, wherein the diagnostic system comprises a light source that produces at least a first diagnostic light beam and a second diagnostic light beam, wherein:
the first diagnostic light beam is directed toward the target to provide a first interaction between the first diagnostic light beam and the target at a first location within the second region; and
the second diagnostic light beam is directed toward the target to provide a second interaction between the second diagnostic light beam and the target at a second location within the second region.

7. The apparatus of claim 6, wherein the diagnostic system comprises a detection system that detects light that is produced from the first interaction and light that is produced from the second interaction, the detection system configured to output the data relating to the first and second interactions.

8. The apparatus of claim 1, wherein the moving property of the target is one or more of a speed of the target, a direction of the target trajectory, and an acceleration of the target.

9. A method of measuring a moving property of a target as it travels along a trajectory in a laser produced plasma extreme ultraviolet light source, the method comprising:
releasing a current target along a trajectory toward a target space, the current target including a component that emits extreme ultraviolet (EUV) light when converted to plasma;
directing a preliminary radiation pulse toward the target space to deliver energy to the current target to modify a geometric distribution of the current target;
directing a main radiation pulse toward the target space, an interaction between the main radiation pulse and the current target converting at least part of the current target into plasma that emits extreme ultraviolet light;
determining one or more moving properties of the current target before the current target enters the target space and after a prior and adjacent target has interacted with a prior radiation pulse in the target space; and
controlling one or more of a relative position between the main radiation pulse and a present target, and a relative position between the preliminary radiation pulse and a present target based on the determined one or more moving properties of the current target, wherein the present target is either the current target that has entered the target space or another target that has entered the target space after the current target has interacted with the preliminary radiation pulse and the main radiation pulse.

10. The method of claim 9, wherein the one or more moving properties of the current target are determined by measuring one or more of a speed of the current target, an acceleration of the current target, and a direction at which the current target moves.

11. The method of claim 9, further comprising:
detecting a first interaction between a first diagnostic light beam and the current target at a first location; and
detecting a second interaction between a second diagnostic light beam and the current target at a second location that is distinct from the first location;
wherein the one or more moving properties of the current target are determined by analyzing the detections of the first and second interactions.

12. The method of claim 11, further comprising:
directing the first diagnostic light beam toward the current target at the first location; and
directing the second diagnostic light beam toward the current target at the second location;
wherein the first interaction is detected by detecting light that is produced from the first interaction; and the second interaction is detected by detecting light that is produced from the second interaction.

13. A method of measuring a moving property of a target as it travels along a trajectory in a laser produced plasma extreme ultraviolet light source, the method comprising:
releasing a current target along a trajectory toward a target space, the current target including a component that emits extreme ultraviolet (EUV) light when converted to plasma;
directing a preliminary radiation pulse toward the target space to deliver energy to the current target to modify a geometric distribution of the current target;
directing a main radiation pulse toward the target space, an interaction between the main radiation pulse and the current target converting at least part of the current target into plasma that emits extreme ultraviolet light;
detecting a first interaction between a first diagnostic light beam and the current target at a first location;
detecting a second interaction between a second diagnostic light beam and the current target at a second location that is distinct from the first location;
detecting a third interaction between a third diagnostic light beam and the current target at a third location that is distinct from the first and second locations;
determining one or more moving properties of the current target before the current target enters the target space; and
controlling one or more of a relative position between the main radiation pulse and a present target, and a relative position between the preliminary radiation pulse and a present target based on the determined one or more moving properties of the current target, wherein the present target is either the current target that has entered the target space or another target that has entered the target space after the current target has interacted with the preliminary radiation pulse and the main radiation pulse.

14. The method of claim 9, wherein the relative position between the preliminary radiation pulse and the present target is controlled based on an analysis of the determined moving property of the target, and by adjusting one or more of a timing of a release of the preliminary radiation pulse and a direction at which the preliminary radiation pulse travels.

15. An apparatus comprising:
a chamber that defines a target space, a first region, and a second region closer to the target space than the first region;
a target delivery system configured to release a plurality of targets each along a trajectory toward the target space, wherein each target includes a component that emits extreme ultraviolet (EUV) light when converted to plasma;
a diagnostic system that diagnostically interacts with a current target when the current target is within the second region and after a prior and adjacent target has interacted with a prior radiation pulse in the target space, wherein the diagnostic system comprises:
a single light source configured to produce a light beam; and
one or more optical components configured to split the light beam into two diagnostic light beams and direct the diagnostic light beams in parallel directions toward the trajectory to thereby intersect with and interact with the current target at distinct locations and times such that the beam waists of the diagnostic light beams overlap the trajectory; and
a control system that is in communication with the optical source and the diagnostic system, and is configured to determine one or more moving properties of the current target based on data outputted from the diagnostic system.

16. The apparatus of claim 15, wherein a distance between the distinct locations at which the diagnostic light beams interact with the current target is between about 250 μm and 800 μm.

17. The apparatus of claim 15, wherein the second region extends up to 1.5 mm from the target space.

18. The apparatus of claim 15, wherein the diagnostic system comprises a detection module configured to detect information produced from the respective interactions between the current target and the diagnostic light beams and to output a one-dimensional signal related to the detected information that is received by the control system.

19. A method for measuring a moving property of a target as it travels along a trajectory in a laser produced plasma extreme ultraviolet light source, the method comprising: releasing a target along its trajectory toward a target space, the target having a first value of a moving property in a first region along the trajectory and having a second value of the moving property in a second region along the trajectory, the second region being closer to the target space than the first region and being within 1.5 mm of the target space, and the second value of the moving property being different from the first value of the moving property; detecting at least two diagnostic interactions with the target while the target is in the second region including detecting interactions between the target and at least two diagnostic probes while the target is in the second region and after a prior and adjacent target has interacted with a prior radiation pulse in the target space; and determining the second value of the moving property of the target based on an analysis of a one-dimensional signal that is generated from the detected at least two diagnostic interactions; wherein the moving property of the target is one or more of a speed of the target, a velocity of the target, and an acceleration of the target.

20. The method of claim 19, further comprising:
directing a radiation pulse toward the target space, the radiation pulse converting at least part of the target into plasma that emits extreme ultraviolet light when the radiation pulse interacts with the target, and
prior to directing the radiation pulse toward the target space, directing a preliminary radiation pulse toward the target in the target space to deliver energy to the target to modify a geometric distribution of the target.

21. The method of claim 20, further comprising controlling one or more of a relative position between the preliminary radiation pulse and the target and a relative position between the radiation pulse and the target based on the determined second value of the moving property of the target.

22. The method of claim 21, further comprising analyzing the determined second value of the moving property, wherein controlling the relative position between the preliminary radiation pulse and the target or the relative position between the radiation pulse and the target is based on the analysis of the determined second value of the moving property of the target.

23. The method of claim 22, wherein:
controlling the relative position between the preliminary radiation pulse and the target comprises adjusting one or more of a timing of a release of the preliminary radiation pulse and a direction at which the preliminary radiation pulse travels; and
controlling the relative position between the radiation pulse and the target comprises adjusting one or more of a timing of a release of the radiation pulse and a direction at which the radiation pulse travels.

* * * * *